United States Patent
Nishikubo et al.

(10) Patent No.: US 8,981,625 B2
(45) Date of Patent: Mar. 17, 2015

(54) ORGANIC PIEZOELECTRIC MATERIAL, ULTRASOUND PROBE, AND ULTRASOUND IMAGE DETECTOR

(75) Inventors: Yuichi Nishikubo, Kawasaki (JP); Rie Fujisawa, Ebina (JP)

(73) Assignee: Konica Minolta Medical & Graphics, Inc., Tokyo (JP)

(*) Notice: Subject to any disclaimer, the term of this patent is extended or adjusted under 35 U.S.C. 154(b) by 822 days.

(21) Appl. No.: 13/263,985

(22) PCT Filed: Feb. 23, 2010

(86) PCT No.: PCT/JP2010/052716
§ 371 (c)(1),
(2), (4) Date: Oct. 11, 2011

(87) PCT Pub. No.: WO2010/119724
PCT Pub. Date: Oct. 21, 2010

(65) Prior Publication Data
US 2012/0041314 A1    Feb. 16, 2012

(30) Foreign Application Priority Data
Apr. 14, 2009   (JP) .................. 2009-097975

(51) Int. Cl.
*H01L 41/193* (2006.01)
*H01L 41/45* (2013.01)
*C08K 3/22* (2006.01)
*C08K 5/21* (2006.01)

(52) U.S. Cl.
CPC ............ *H01L 41/193* (2013.01); *H01L 41/45* (2013.01); *C08K 3/22* (2013.01); *C08K 5/21* (2013.01)
USPC ....................................... 310/358

(58) Field of Classification Search
USPC ........................................... 310/358
See application file for complete search history.

(56) References Cited

U.S. PATENT DOCUMENTS

| | | | | |
|---|---|---|---|---|
| 5,833,880 A | * | 11/1998 | Siemensmeyer et al. | 252/299.64 |
| 6,099,752 A | * | 8/2000 | Hall et al. | 252/299.63 |
| 2003/0025104 A1 | * | 2/2003 | Obi et al. | 252/299.01 |

FOREIGN PATENT DOCUMENTS

| | | |
|---|---|---|
| JP | 02-284485 | 11/1990 |
| JP | 05-311399 | 11/1993 |
| JP | 06-216422 | 8/1994 |
| JP | 07-115230 | 5/1995 |
| JP | 2003-324222 | 11/2003 |
| JP | 2007-329334 | 12/2007 |
| JP | 2008-279114 | 11/2008 |

* cited by examiner

*Primary Examiner* — Derek Rosenau
(74) *Attorney, Agent, or Firm* — Lucas & Mercanti, LLP

(57) ABSTRACT

In the present invention, provided is an organic piezoelectric material specifically exhibiting high orientation and thermal stability as an organic piezoelectric material exhibiting an excellent piezoelectric characteristic and having piezoelectricity and pyroelectricity, which is capable of converting thermal or mechanical simulation into electrical energy, and also provided are an ultrasound probe for which the organic piezoelectric material is used, and an ultrasound image detector thereof. It is a feature that an organic piezoelectric material of the present invention possesses a compound represented by Formula (1) and a base material made of an organic polymeric material, satisfying Expression (1): |C Log P (1)−C Log P (base material)|≤3.0 when C Log P values of the compound and the base material are expressed as C Log P (1) and C Log P (base material), respectively.

6 Claims, 1 Drawing Sheet

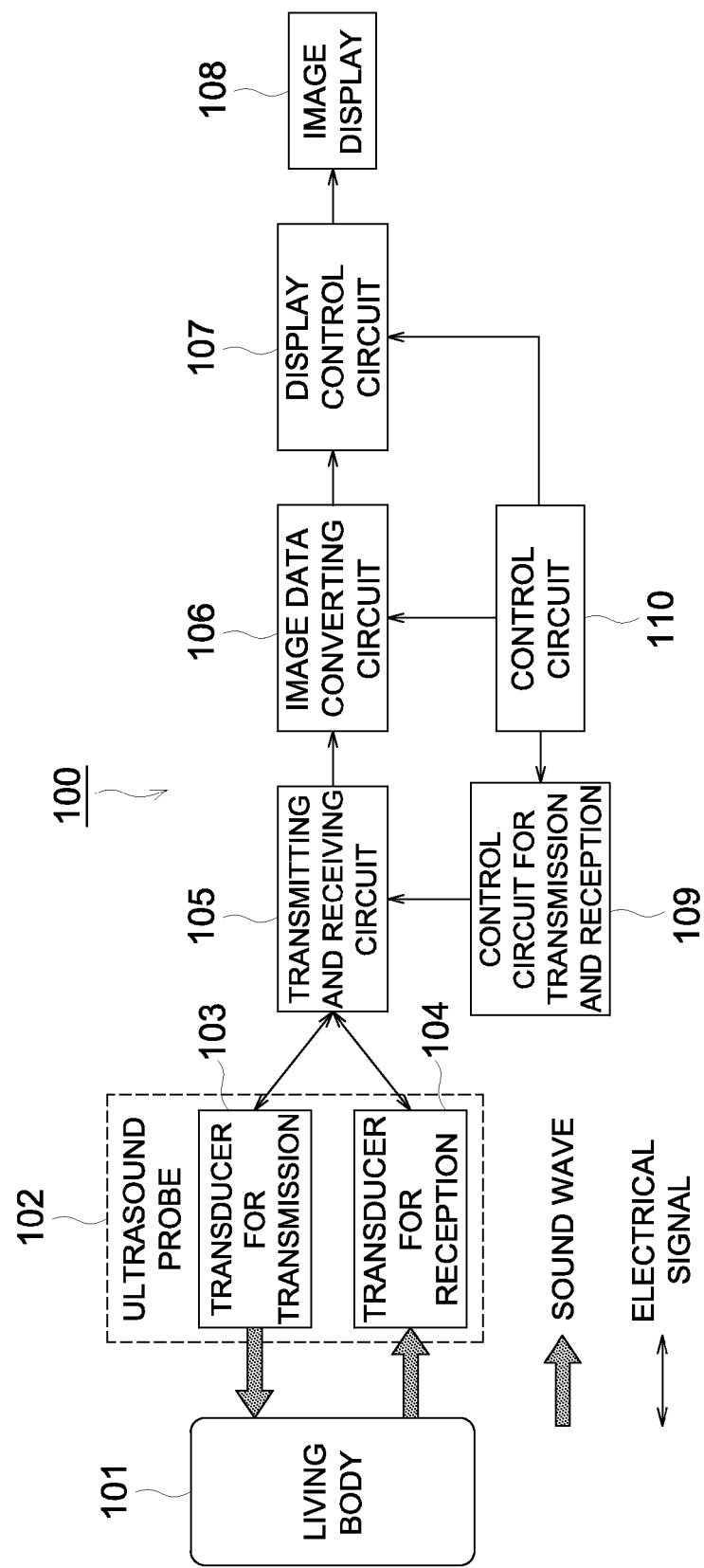

ORGANIC PIEZOELECTRIC MATERIAL, ULTRASOUND PROBE, AND ULTRASOUND IMAGE DETECTOR

CROSS REFERENCE TO RELATED APPLICATIONS

This Application is a 371 of PCT/JP2010/052716 filed Feb. 23, 2010 which, in turn, claimed the priority of Japanese Patent Application No. 2009-097975 filed Apr. 14, 2009, both applications are incorporated by reference herein.

TECHNICAL FIELD

The present invention relates to an organic piezoelectric material, an ultrasound probe for which the organic piezoelectric material is used, and an ultrasound image detector thereof.

BACKGROUND

An organic piezoelectric material exhibiting piezoelectricity and pyroelectricity, which is usable for converting thermal or mechanical stimulation into electrical energy, has been conventionally known with respect to acoustic equipment such as a microphone or speaker diaphragm, measuring instruments such as various thermal sensors, a pressure sensor, an infrared detector and so forth, an ultrasound probe, a vibration sensor having a high sensitivity for detecting mutation of genes and proteins, and so forth.

As a piezoelectric and pyroelectric body, widely used is a so-called inorganic piezoelectric material, for example, a single crystal of quartz, $LiNbO_3$, $LiTaO_3$, $KNbO_3$ or the like, a thin film made of ZnO, AlN or the like, and a sintered material composed of $Pb(Zr, Ti)O_3$ system or the like, which have been subjected to a polarization. However, a piezoelectric material as such an inorganic material exhibits properties such as high elastic stiffness, high mechanical loss factor, high density, and high dielectric constant.

On the other hand, an organic piezoelectric material such as polyvinylidene fluoride (hereinafter, referred to as "PVDF"), polyvinylidene cyanide (hereinafter, referred to as "PVDCN") or the like has been developed (refer to Patent Document 1, for example). The organic piezoelectric material has a feature in which capability of preparing a thin film accompanied with producing a large area and so forth is excellent, those in any shape and structure can be prepared, and low elastic modulus as well as low dielectric constant is realized, whereby high sensitivity detection is possible to be realized in consideration of application as a sensor. In contrast, the organic piezoelectric material was limited to the available temperature range since the piezoelectric and pyroelectric characteristic disappears at high temperature because of low heat resistance, and properties such as elastic stiffness and so forth are also largely reduced.

With respect to such a limitation, since a polyurea resin composition has a large dipole moment originated from a urea bond, and exhibits an excellent temperature characteristic as a resin, various studies for the organic piezoelectric material have been done. For example, disclosed is a so-called vapor deposition polymerization method by which a diisocyanate compound such as 4,4'-diphenylmethane diisocyanate (MDI) or the like and a diamine compound such as 4,4'-diaminodiphenylmethane (MDA) or the like are evaporated at the same time to form a polyurea film (refer to Patent Documents 2 and 3, for example). However, since as to a polyurea resin composition prepared by a vapor deposition polymerization method described herein, the molecular weight of the resulting oligomer or polymer becomes heterogeneous, the polyurea resin composition is formed in a state of insufficient orientation when it is polymerized with polarization. For this reason, a dipole moment originated from a urea bond can not be sufficiently utilized, and further improvement for the organic piezoelectric material has been demanded.

There is a report in which a ferroelectric liquid crystal compound is utilized as a piezoelectric material (refer to Patent Document 4, for example), but in the case of those which have been reported so far, since kinds of polarization groups in the liquid crystal molecule are limited, spontaneous polarization and piezoelectricity are not sufficient those satisfying performance desired as a piezoelectric material have not yet been found out.

Further, there is another report in which a composite piezoelectric material obtained by mixing a material exhibiting piezoelectricity in a base material made of a polymeric material is applied for an ultrasound transducer, but in the case of those which have been reported so far, an aggregate produced in a piezoelectric material caused discontinuous interface and thereby produced reflection and scattering of ultrasound waves, and the foregoing ultrasound transducer was unsuitable as an ultrasound transducer with which efficient transmission and reception are performed.

PRIOR ART DOCUMENT

Patent Document

Patent Document 1: Japanese Patent O.P.I. (Open to Public Inspection) Publication No. 6-216422
Patent Document 2: Japanese Patent O.P.I. Publication No. 2-284485
Patent Document 3: Japanese Patent O.P.I. Publication No. 5-311399
Patent Document 3: Japanese Patent O.P.I. Publication No. 7-115230

DISCLOSURE OF THE INVENTION

Problems to be Solved by the Invention

The present invention has been made on the basis of the above-described situation and problems, and as the problems to be solved, it is an object of the present invention to provide an organic piezoelectric material specifically exhibiting high orientation and thermal stability as an organic piezoelectric material exhibiting an excellent piezoelectric characteristics and having piezoelectricity and pyroelectricity, which is capable of converting thermal or mechanical simulation into electrical energy, and also to provide an ultrasound probe for which the organic piezoelectric material is used, and an ultrasound image detector thereof.

Means to Solve the Problems

The above-described problems in the present invention can be solved by the following structures.

(Structure 1) An organic piezoelectric material comprising a compound represented by the following Formula (1) and a base material made of an organic polymeric material, satisfying the following Expression (1) when C Log P values of the compound and the base material are expressed as C Log P (1) and C Log P (base material), respectively:

$$R_1\text{-}Q\text{-}(\text{-}A_1\text{-})\text{-}Y\text{-}Z, \quad \text{Formula (1)}$$

wherein $R_1$ represents one selected from the group consisting of an aliphatic group, an aromatic group and a heterocyclic group; Q is a single bond, an oxygen atom or a sulfur atom; $A_1$ represents a mesogenic group; Y represents one selected from the group consisting of a urea group, a thiourea group, a urethane group, a thiourethane group, an amide group, a thioamide group, a sulfamoyl group and a carbonate group; and Z represents one selected from the group consisting of an aliphatic group having 1-25 carbon atoms, an aromatic group and a heterocyclic group, and $|C \text{ Log } P(1) - C \text{ Log } P(\text{base material})| \leq 3.0$,   Expression (1)

wherein the C Log P represents "calculated log P" determined via Hansen's and Leo's fragment approach.

(Structure 2) The organic piezoelectric material of Structure 1, wherein $R_1$ in Formula (1) represents an alkyl group having 1-20 carbon atoms or an oxyalkyl group.

(Structure 3) The organic piezoelectric material of Structure 1 or 2, wherein Z in Formula (1) represents a substituent comprising an asymmetric carbon atom.

(Structure 4) The organic piezoelectric material of any one of Structures 1-3, comprising the compound represented by Formula (1) and a compound represented by the following Formula (2) as the base material made of the organic polymeric material, satisfying the following Expression (2) when a C Log P value of the compound represented by Expression (2) is expressed as C Log P (2):

Formula (2)

wherein $R_{21}$ represents a hydrogen atom or a methyl group, p is an integer of 5 or more, $B_1$ represents an alkylene group or an oxyalkylene group, $B_2$ represents a mesogenic group, $Z_2$ represents one selected from the group consisting of an aliphatic group having 1-25 carbon atoms, an aromatic group and a heterocyclic group, and $|C \text{ Log } P(1) - C \text{ Log } P(2)| \leq 3.0$,   Expression (2)

wherein the C Log P represents "calculated log P" determined via Hansen's and Leo's fragment approach, (Structure 5) An ultrasound probe comprising a transducer for ultrasound transmission and an ultrasound transducer comprising the organic piezoelectric material of any one of Structures 1-4 as a transducer for ultrasound reception.

(Structure 6) An ultrasound image detector comprising the ultrasound probe of Structure 5.

Effect of the Invention

The present invention can provide an organic piezoelectric material specifically showing high orientation and thermal stability as an organic piezoelectric material exhibiting an excellent piezoelectric e characteristic and having piezoelectricity and pyroelectricity, which is capable of converting thermal or mechanical simulation into electrical energy, and also provide an ultrasound probe for which the organic piezoelectric material is used, and an ultrasound image detector thereof.

BRIEF DESCRIPTION OF THE DRAWINGS

FIG. 1 is a conceptual diagram showing a structure of main parts of diagnostic ultrasound systems in an embodiment of the present invention.

DESCRIPTION OF THE PREFERRED EMBODIMENTS

An organic piezoelectric material of the present invention is an organic piezoelectric material containing a compound represented by the foregoing Formula (1) and a base material made of an organic polymeric material, the organic piezoelectric material satisfying the foregoing Expression (1) when C Log P values of the compound and the base material are expressed as C Log P (1) and C Log P (base material), respectively. This feature is a technical feature common to the invention of any one of Structures 1-6.

In the embodiment of the present invention, $R_1$ in the foregoing Formula (1) preferably represents an alkyl group having 1-20 carbon atoms or an oxyalkyl group. Further, Z in Formula (1) preferably represents a substituent comprising an asymmetric carbon atom.

In the present invention, the organic piezoelectric material comprising the compound represented by the foregoing Formula (1) and a compound represented by the foregoing Formula (2) as the base material made of the organic polymeric material preferably satisfies the foregoing Expression (2) when a C Log P value of the compound represented by Expression (2) is expressed as C Log P (2).

An organic piezoelectric material of the present invention is preferably usable for an ultrasound transducer, and specifically usable for a transducer for ultrasound reception. Further, an ultrasound probe for which the organic piezoelectric material is used can be preferably utilized. Accordingly, the ultrasound probe is preferably usable for an ultrasound image detector.

Next, the present invention, constituent elements in the present invention, and embodiments of the present invention will be described in detail.

In the present invention, since not only excellent piezoelectricity together with pyroelectricity but also thermal stability can be obtained by using a compound represented by Formula (1) as an organic piezoelectric material, it can be used as an organic piezoelectric material exhibiting high versatility.

<Compound Represented by Formula (1)>

$R_1$ in Formula (1) represents one selected from the group consisting of an aliphatic group, an aromatic group and a heterocyclic group. "Aliphatic group" in the present specification is referred to as an alkyl group, a cycloalkyl group, an alkenyl group, a cycloalkenyl group, an alkynyl group or an oxyalkyl group which is substituted or unsubstituted.

Specific examples of the aliphatic group represented by $R_1$ include an alkyl group such as a methyl group, an ethyl group, a propyl group, an isopropyl group, a tert-butyl group, a pentyl group, a hexyl group, heptyl group, an octyl group, a decyl group, a dodecyl group an octadecyl group or the like; a cycloalkyl group such as a cyclohexyl group, a cyclopentyl group or the like; an alkenyl group; a cycloalkenyl group; and an alkynyl group such as a propargyl group or the like.

Specific examples of the aromatic group include a phenyl group, a naphthyl group, an anthracenyl group and so forth, and specific examples of the heterocyclic group include a lysyl group, a thiazolyl group, an oxazolyl group, an imidazolyl group, a furyl group, a pyrrolyl group, a pyrazinyl group, a pyrimidinyl group, a pyridazinyl group, a selenazolyl group, a sulfolanyl group, a piperidinyl group, a pyrazolyl group, a tetrazolyl group and so forth. Further, these groups may also be substituted by these groups.

$R_1$ is preferably an aliphatic group having 1-20 carbon atoms; more preferably an alkyl group having 3-20 carbon atoms; and still more preferably an alkyl group having 6-18 carbon atoms.

Q represents a single bond or an oxygen atom. In the present invention, the single bond means that $R_1$ is directly bonded to $A_1$.

$A_1$ represents a mesogenic group. The mesogenic group in the present invention means an adamant unit necessary for a compound exhibiting liquid crystallinity, and one in which at least two ring structures are combined directly or with linking groups.

Mesogenic groups each represented by $A_1$ are shown below.

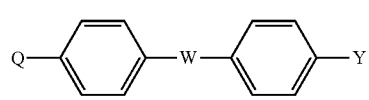
(A-1)

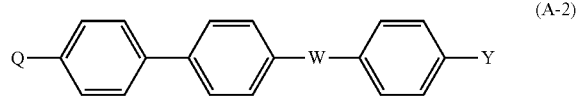
(A-2)

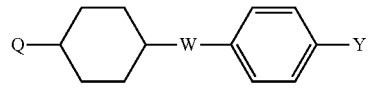
(A-3)

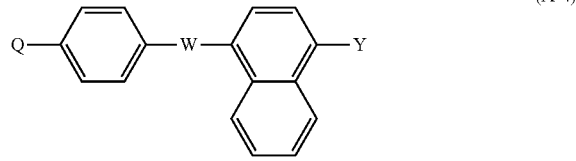
(A-4)

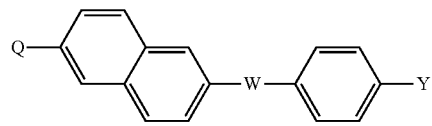
(A-5)

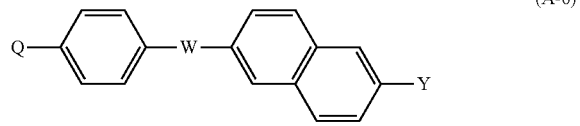
(A-6)

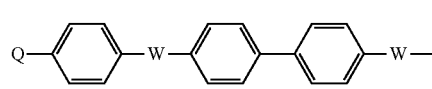
(A-7)

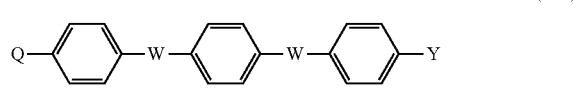
(A-8)

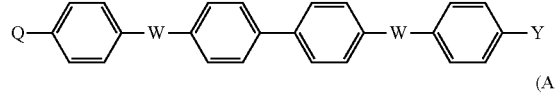
(A-9)

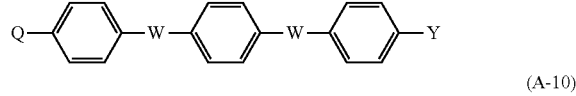
(A-10)

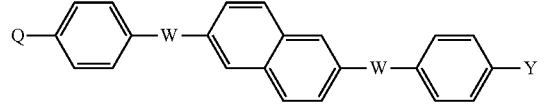
(A-11)

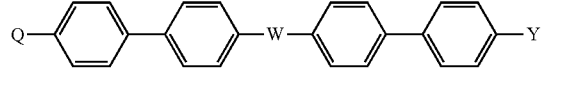
(A-12)

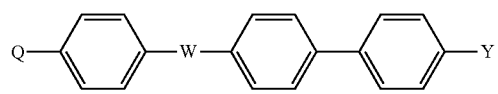
(A-13)

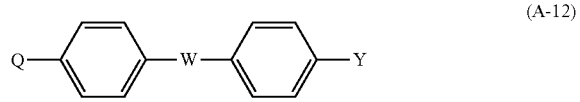
(A-14)

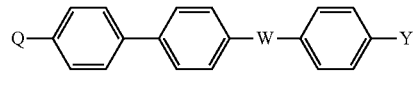
(A-15)

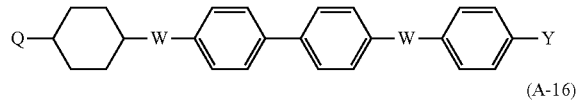
(A-16)

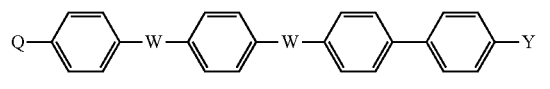
(A-17)

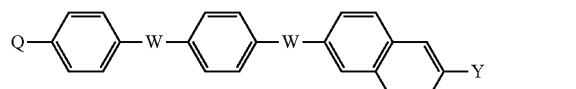
(A-18)

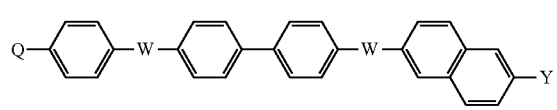
(A-19)

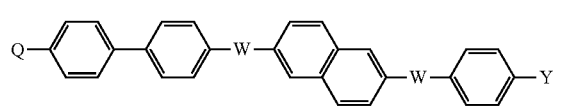
(A-20)

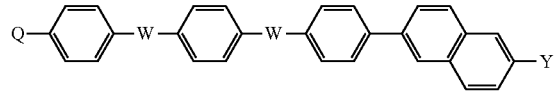
(A-21)

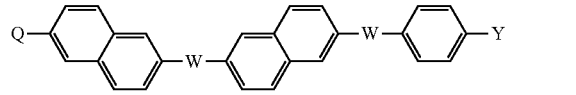
(A-22)

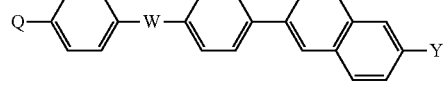

-continued
(A-23) 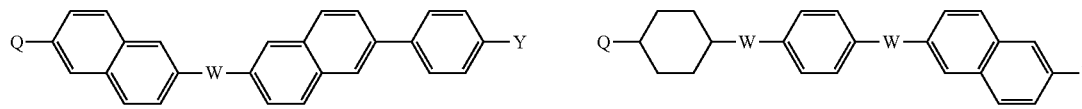
(A-24) 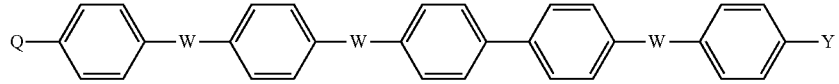
(A-25) 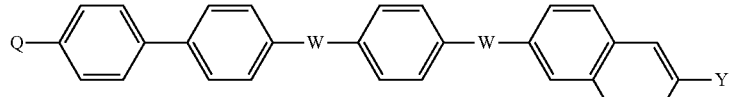
(A-26) 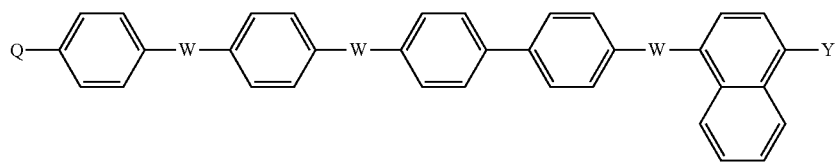
(A-27) 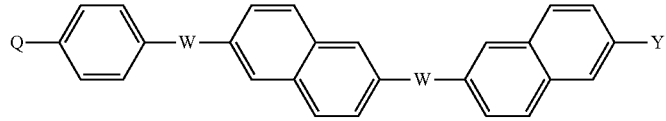
(A-28) 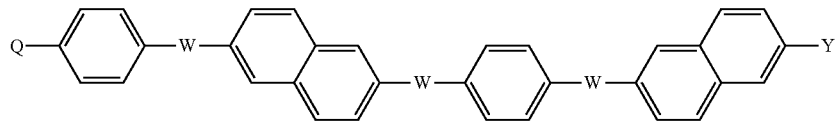
(A-29) 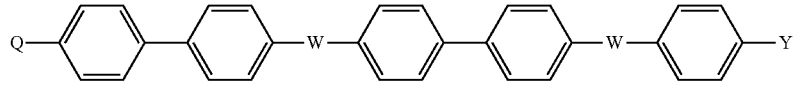
(A-30) 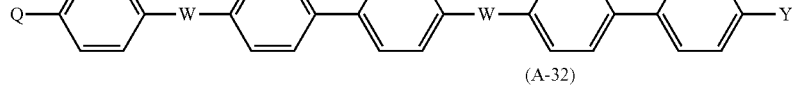
(A-31) 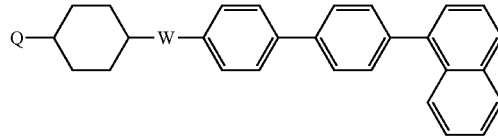
(A-32) 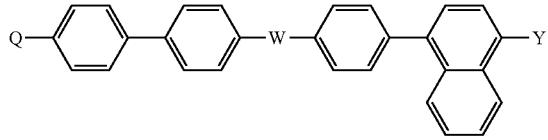
(A-33) 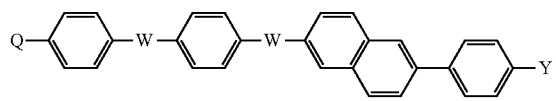
(A-34) 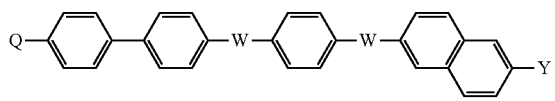
(A-35) 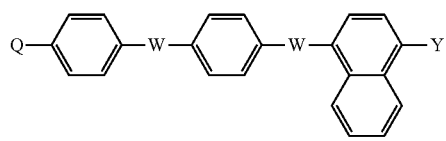
(A-36) 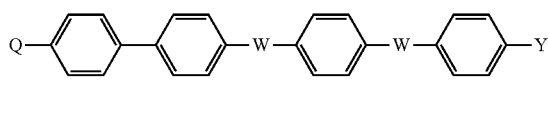
(A-37) 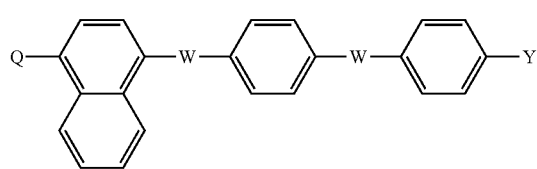
(A-38)

-continued
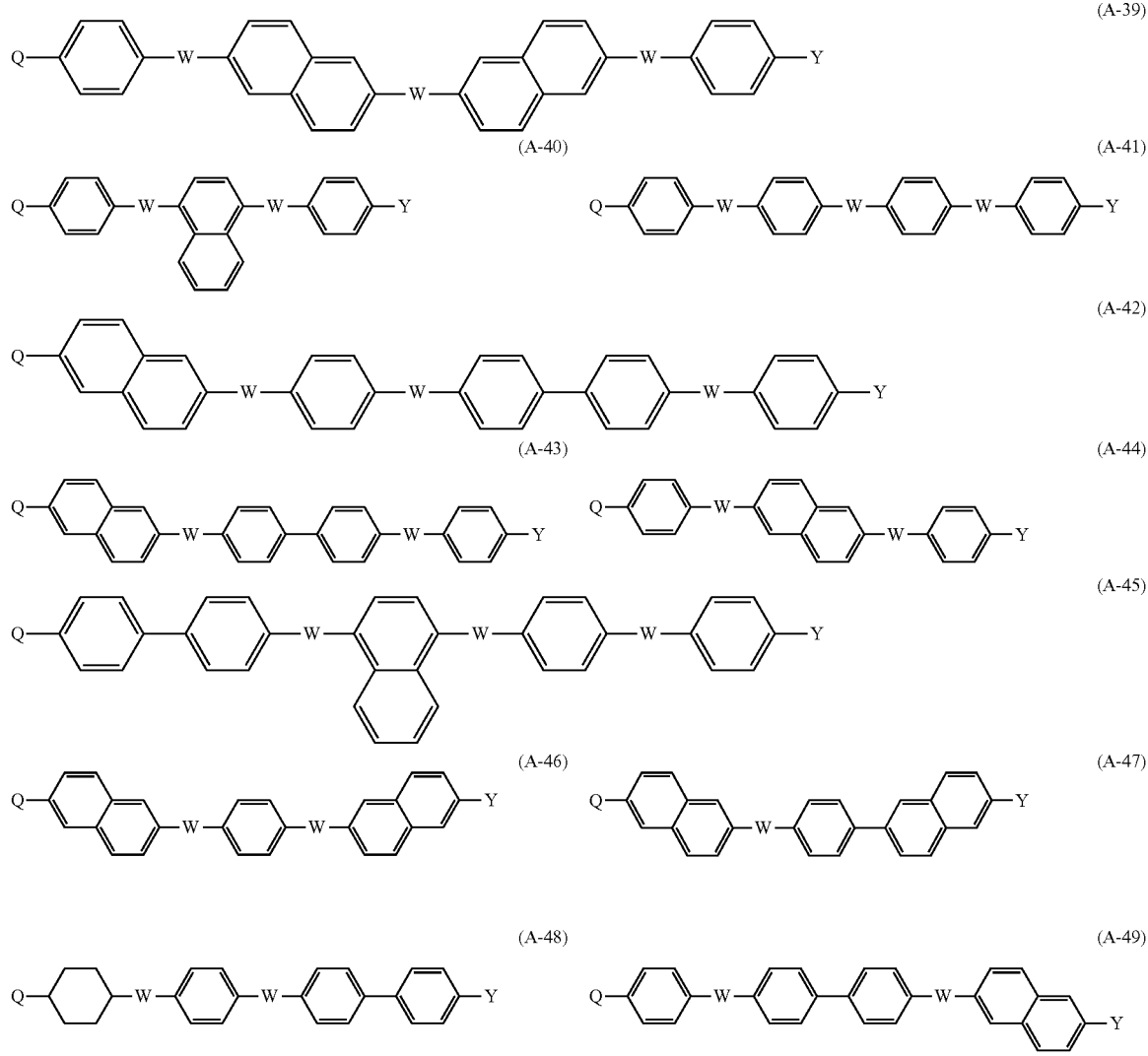
Next, preferable mesogenic groups are shown below.
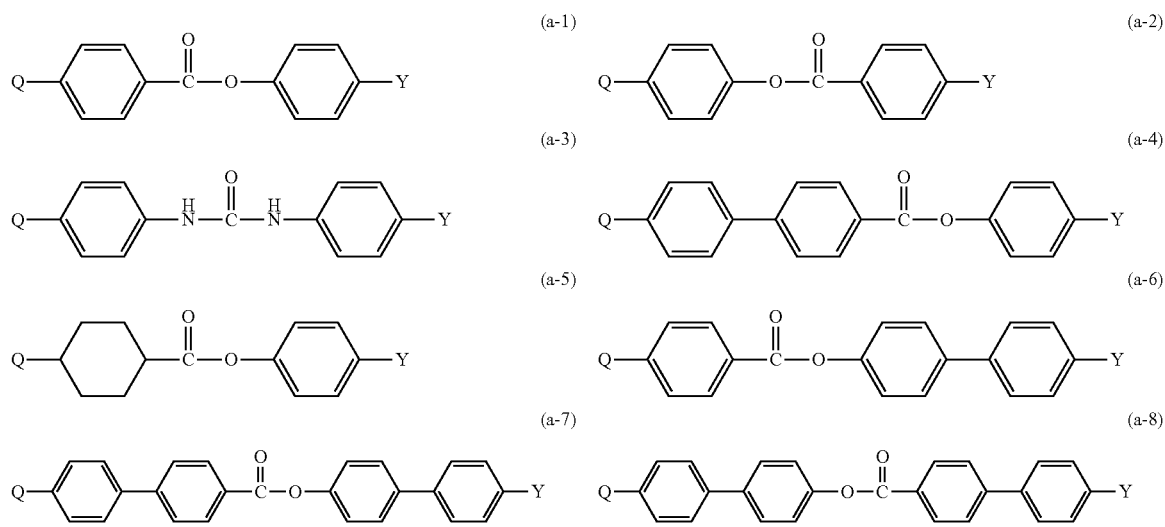

-continued
(a-9)
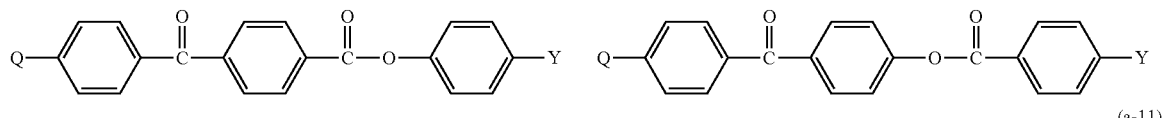
(a-10)
(a-11)
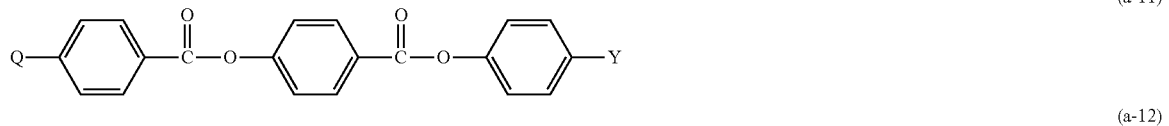
(a-12)
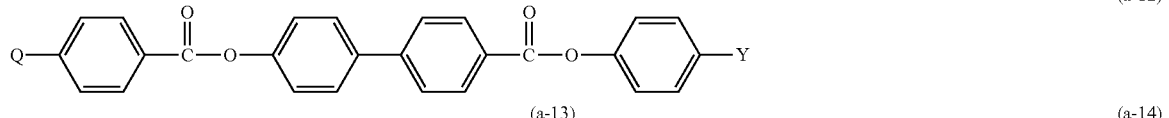
(a-13)
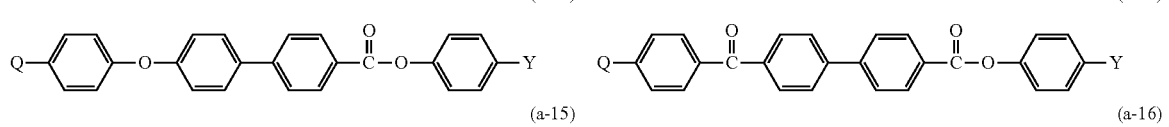
(a-14)
(a-15)
(a-16)
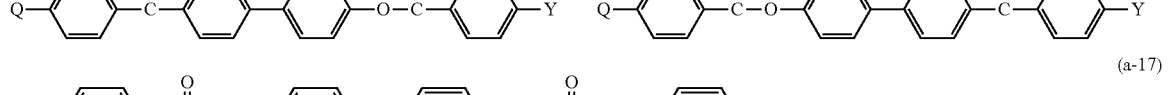
(a-17)
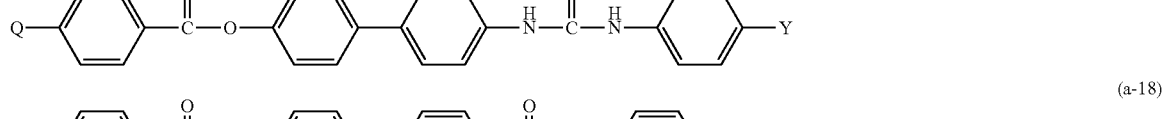
(a-18)
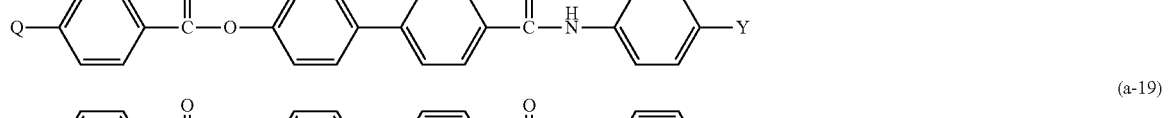
(a-19)
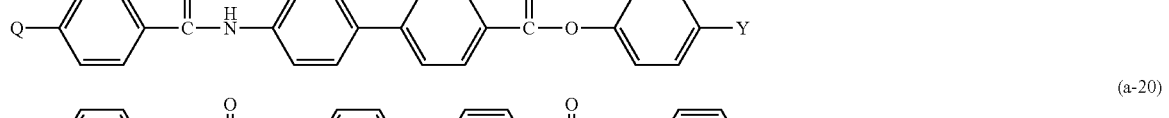
(a-20)
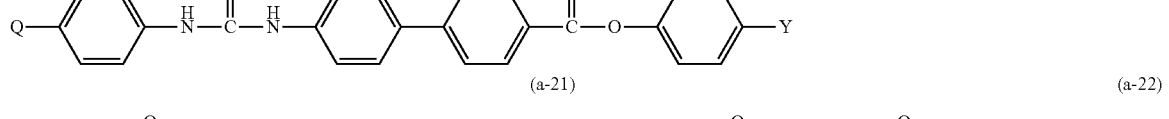
(a-21)
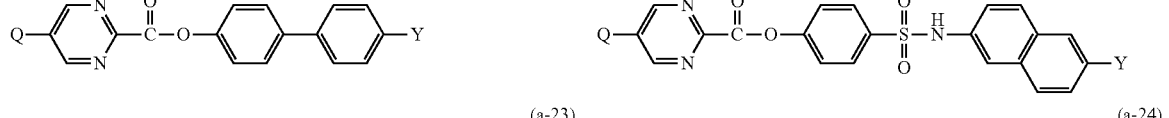
(a-22)
(a-23)
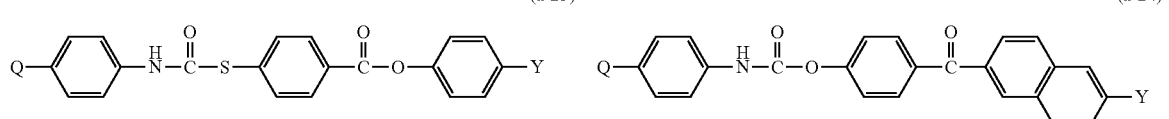
(a-24)
(a-25)
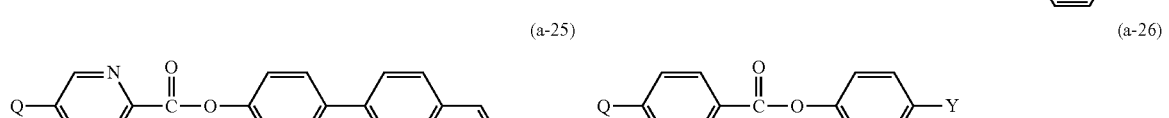
(a-26)
(a-27)
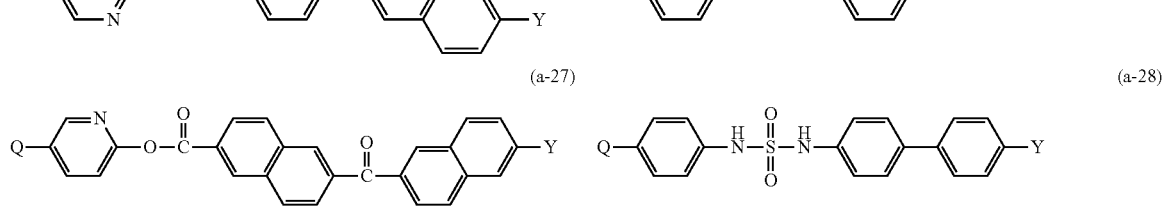
(a-28)

-continued

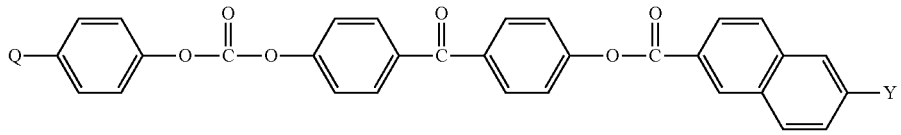
(a-29)

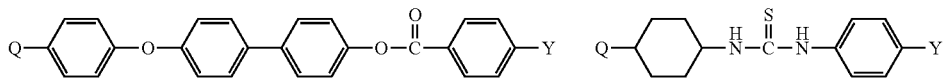
(a-30)   (a-31)

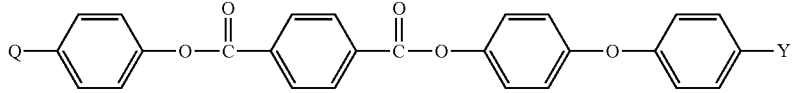
(a-32)

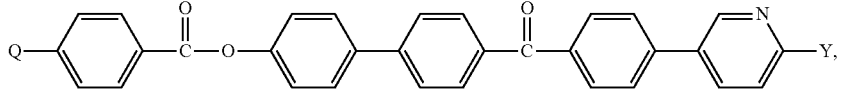
(a-33)

where W represents —COO—, —COS—, —CO—, —COO—, —O—, —S—, —COO—, —NHCONH—, —NHCSNH—, —CONH—, —NHCOO—, —NHCOS—, $SO_2$—NH—, —$NHSO_2NH$—, or —OCOO—. In addition, plural "W"s in the same molecule may be identical to each other, or different from each other.

Y in Formula (1) represents a urea group, a thiourea group, a urethane group, a sulfamoyl group or a carbonate group. Y preferably represents a urea group or a thiourea group.

Examples of the substituent represented by Z in Formula (1) include an alkyl group having 1-25 carbon atoms (such as a methyl group, an ethyl group, a propyl group, an isopropyl group, a tert-butyl group, a pentyl group, a hexyl group, a cyclohexyl group or the like), a halogenated alkyl group (such as a trifluoromethyl group, a perfluorooctyl group or the like), a cycloalkyl group (such as a cyclohexyl group, a cyclopentyl group or the like), an alkynyl group (such as a propargyl group or the like), a glycidyl group, an aromatic group (such as a phenyl group, a naphthyl group or the like), a heterocyclic group (such as a pyridyl group, a thiazolyl group, an oxazolyl group, an imidazolyl group, a furyl group, a pyrrolyl group, a pyrazinyl group, a pyrimidinyl group, a pyridazinyl group, a selenazolyl group, a sulfolanyl group, a piperidinyl group, a pyrazolyl group, a tetrazolyl group or the like), and so forth. Further, these groups may also be substituted by these groups.

Z preferably represents a group containing an asymmetric carbon atom and may be a group containing at least one asymmetric carbon atom, and is not specifically limited, but is a group represented by the following Formula (3) or Formula (4).

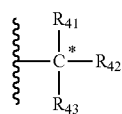

Formula (3)

In Formula (3), symbol * represents an asymmetric carbon atom. Each of $R_{41}$, $R_{42}$ and $R_{43}$ represents a hydrogen atom or a substituent, but there is no case where they are identical to each other.

Examples of the substituent represented by each of $R_{41}$, $R_{42}$ and $R_{43}$ include an alkyl group having 1-25 carbon atoms (such as a methyl group, an ethyl group, a propyl group, an isopropyl group, a tert-butyl group, a pentyl group, a hexyl group, a cyclohexyl group or the like), a halogenated alkyl group (such as a trifluoromethyl group, a perfluorooctyl group or the like), a cycloalkyl group (such as a cyclohexyl group, a cyclopentyl group or the like), an alkynyl group (such as a propargyl group or the like), a glycidyl group, an acrylate group, a methacrylate group, an aromatic group (such as a phenyl group or the like), a heterocyclic group (such as a pyridyl group, a thiazolyl group, an oxazolyl group, an imidazolyl group, a furyl group, a pyrrolyl group, a pyrazinyl group, a pyrimidinyl group, a pyridazinyl group, a selenazolyl group, a sulfolanyl group, a piperidinyl group, a pyrazolyl group, a tetrazolyl group or the like), a halogen atom (such as a chlorine atom, a bromine atom, iodine atoms, a fluorine atom or the like), an alkoxy group (such as a methoxy group, an ethoxy group, a propyloxy group, a pentyloxy group, a cyclopentyloxy group, a hexyloxy group, a cyclohexyloxy group or the like), an aryloxy group (such as a phenoxy group or the like), an alkoxycarbonyl group (such as a methyloxycarbonyl group, an ethyloxycarbonyl group, a butyloxycarbonyl group or the like), an aryloxycarbonyl groups (such as a phenyloxycarbonyl group or the like), a sulfonamide group (such as a methanesulfonamide group, an ethanesulfonamide group, a butanesulfonamide group, a hexanesulfonamide group, a cyclohexanesulfonamide group, a benzenesulfonamide group or the like), a sulfamoyl group (such as an aminosulfonyl group, amethylaminosulfonyl group, a dimethylaminosulfonyl group, a butylaminosulfonyl group, a hexylaminosulfonyl group, a cyclohexylaminosulfonyl group, a phenylaminosulfonyl group, 2-pyridyl amino sulfonyl group or the like), a urethane group (such as a methylureido group, an ethylureido group, a pentylureido group, a cyclohexylureido group, a phenylureido group, 2-pyridylureido group or the like), an acyl group (such as an acetyl group, an propionyl group, a butanoly group, a hexanoly group, a cyclohexanoly group, a benzoyl group, a pyridinoyl group or the like), a carbamoyl group (such as an aminocarbonyl group, a methylaminocarbonyl group, a dimethylaminocarbonyl group, a propylaminocarbonyl group, a pentylaminocarbonyl group, a cyclohexylaminocarbonyl group, a phenylaminocarbonyl group, and 2-pyridylaminocarbonyl group or the like), an amide group (such as an acetamide group, a propionamide group, a butaneamide group, a hexaneamide group, a benzamide group or the like), a sulfonyl group (such as a methylsulfonyl group, an ethylsulfonyl group, a butylsulfonyl group, a cyclohexylsulfonyl group, a phenylsulfonyl group, 2-pyridylsulfonyl group or the like), an amino group (such as an amino group, an ethylamino group, a dimethylamino group, a butylamino group, a cyclopentylamino group, an anilino group, 2-pyridylamino group or the like), a cyano group, a nitro group, a sulfo group, a carboxyl group, a hydroxyl group, an oxamoyl group, and so forth. Further, these groups may also be substituted with these groups.

$R_{41}$ is preferably an alkyl group having 1-6 carbon atoms; more preferably a methyl group, an ethyl group, a trifluoromethyl group or a halogen atom; and still more preferably a methyl group, a trifluoromethyl group or a fluorine atom. $R_{42}$ is preferably a methyl group, an ethyl group, an isopropyl group, an n-butyl group, a tert-butyl group, a hexyl group, an octyl group or a dedecyl group. $R_{43}$ is preferably a hydrogen atom.

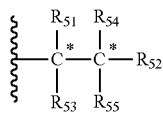

Formula (4)

In Formula (4), symbol * represents an asymmetric carbon atom. Each of $R_{51}$, $R_{52}$, $R_{53}$, $R_{54}$ and $R_{55}$ represents a hydrogen atom or a substituent, but there is no case where $R_{51}$ and $R_{53}$ are identical to each other, and there is no case where $R_{52}$, $R_{54}$ and $R_{55}$ are identical to each other. Examples of the substituent represented by each of $R_{51}$, $R_{52}$, $R_{53}$, $R_{54}$ and $R_{55}$ include substituents exemplified as specific examples of the substituent represented by each of $R_{41}$, $R_{42}$ and $R_{43}$ in Formula (4).

$R_{51}$ is preferably an alkyl group having 1-6 carbon atoms; more preferably a methyl group, an ethyl group, a trifluoromethyl group or a halogen atom; and still more preferably a methyl group, a trifluoromethyl group or a fluorine atom. $R_{53}$ is preferably a hydrogen atom. $R_{52}$ is preferably an alkyl group having 1-12 carbon atoms. $R_{54}$ is preferably an alkyl group having 1-6 carbon atoms; more preferably a methyl group, an ethyl group, a trifluoromethyl group or a halogen atom; and still more preferably a methyl group, an ethyl group, a trifluoromethyl group or a fluorine atom. $R_{55}$ is preferably a hydrogen atom or a fluorine atom.

Specific examples of compound each represented by Formula (1), but the present invention is not limited thereto.

1-1

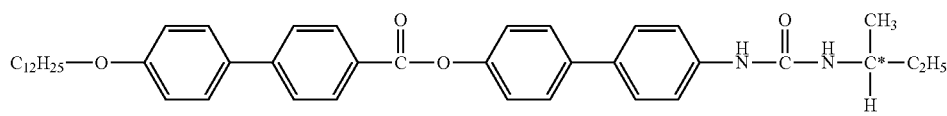

1-2

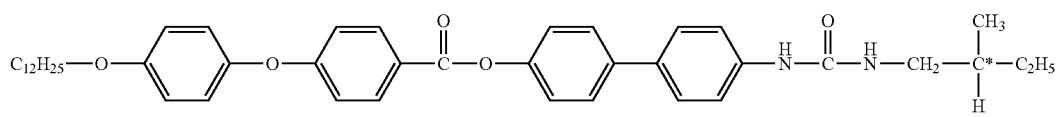

1-3

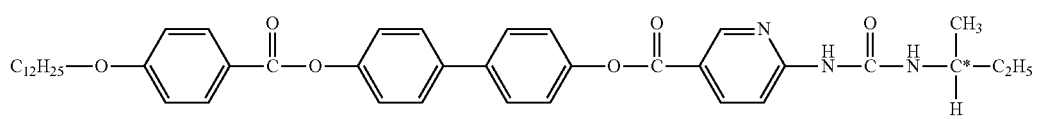

1-4

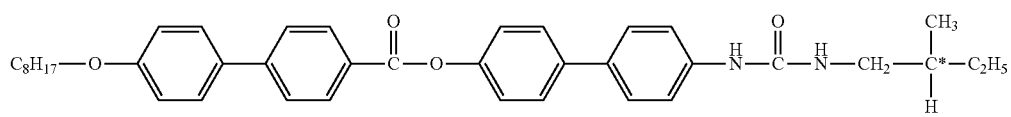

1-5

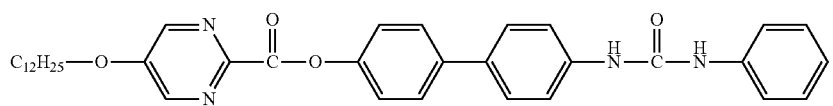

1-6

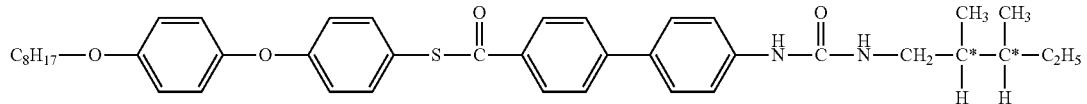

1-7

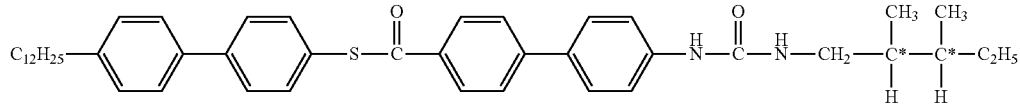

1-8

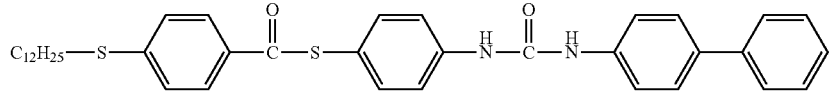

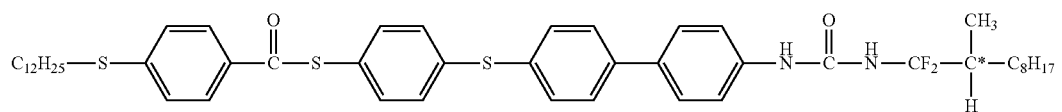
1-9
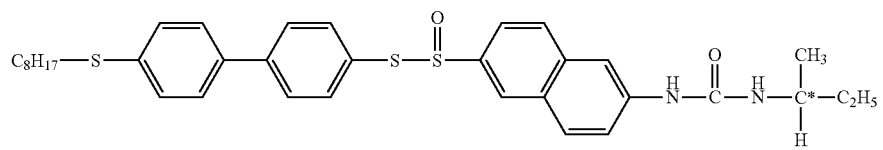
1-10
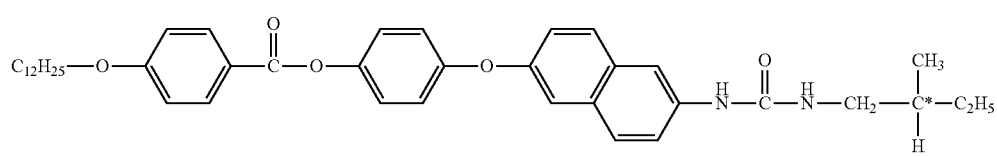
1-11
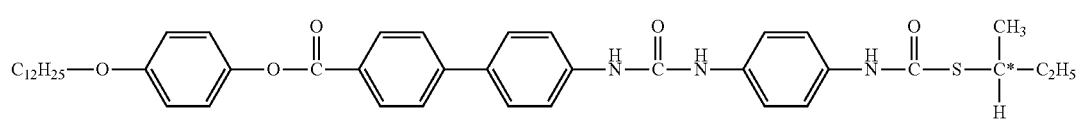
1-12
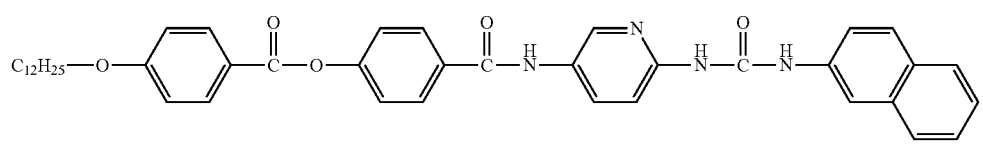
1-13
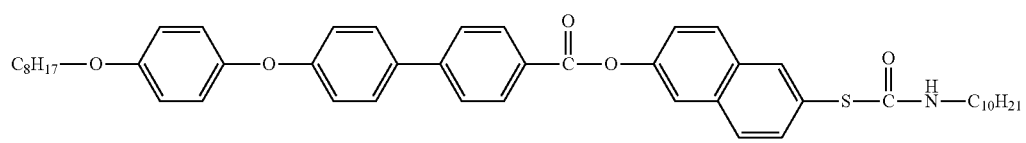
1-14
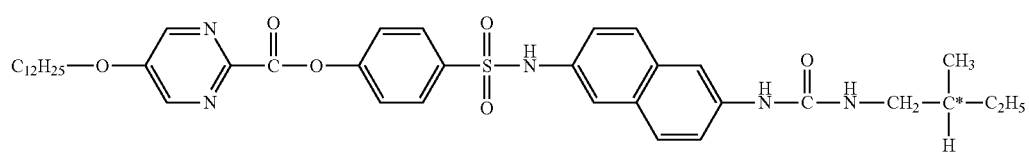
1-15
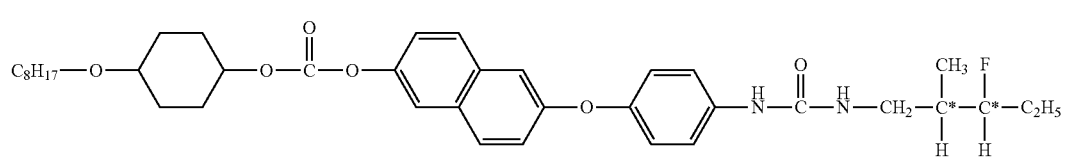
1-16
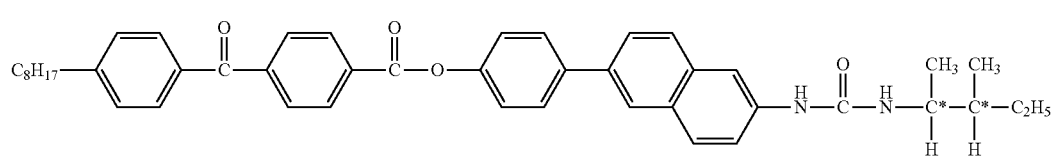
1-17
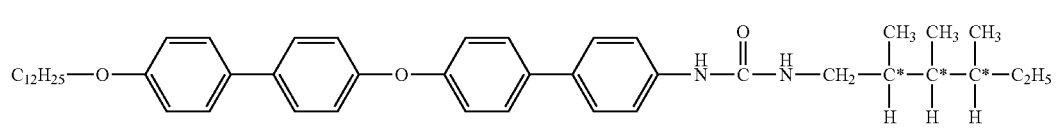
1-18
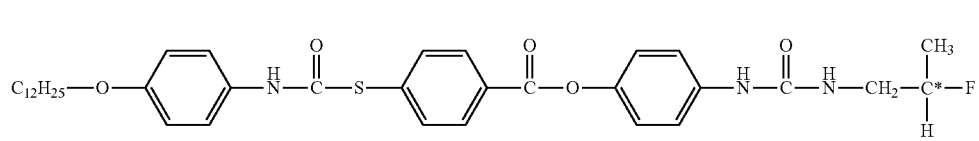
1-19

-continued
1-20
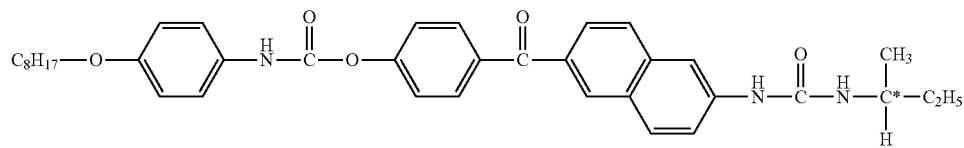
1-21
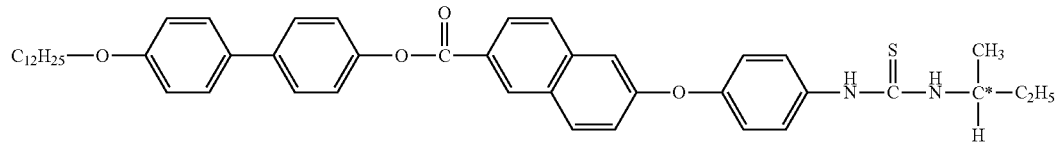
1-22
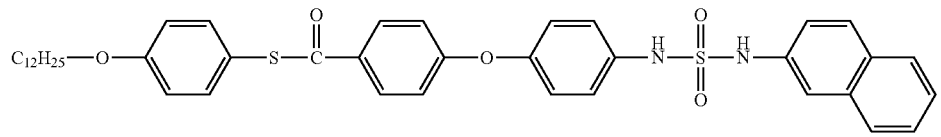
1-23
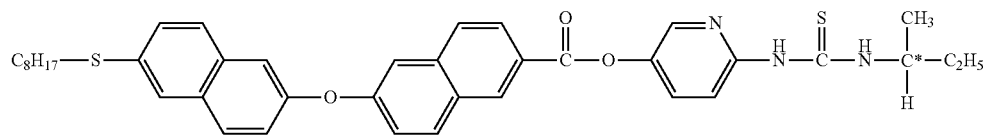
1-24
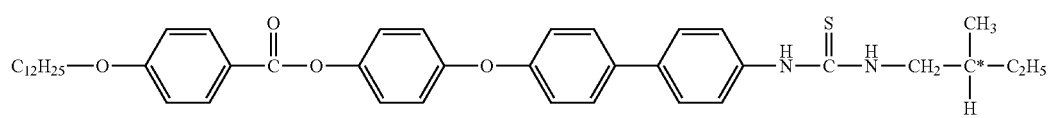
1-25
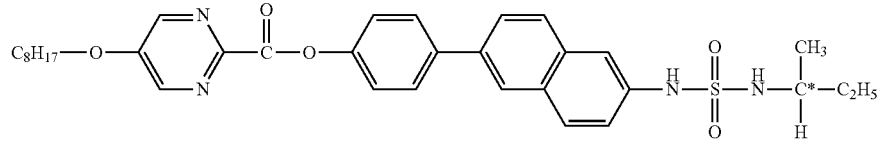
1-26
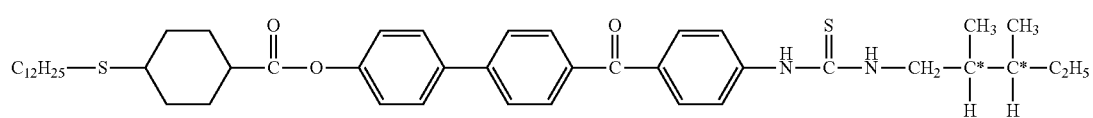
1-27
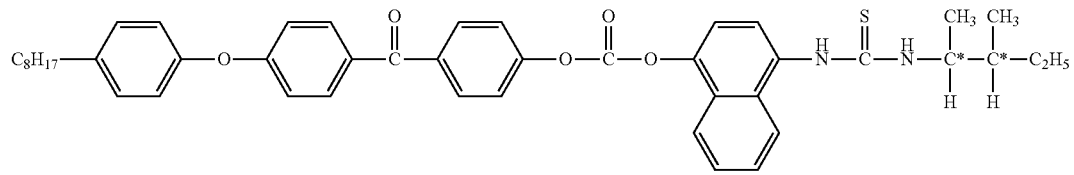
1-28
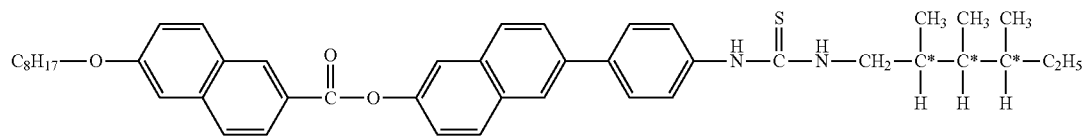
1-29
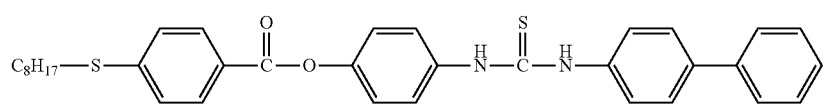
1-30
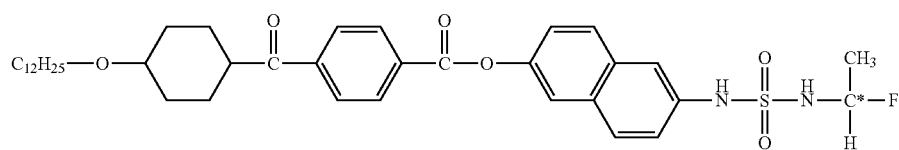

-continued
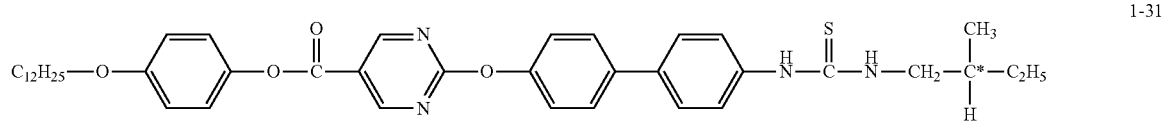
1-31
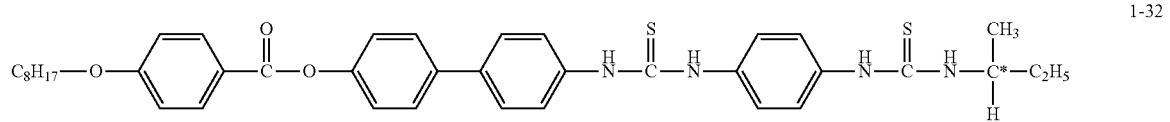
1-32
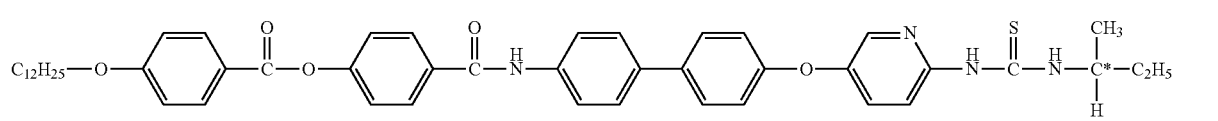
1-33
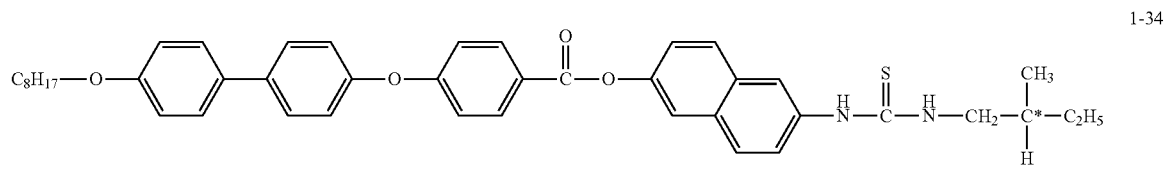
1-34
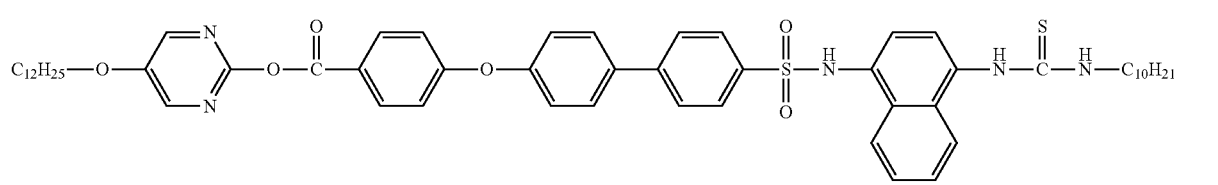
1-35
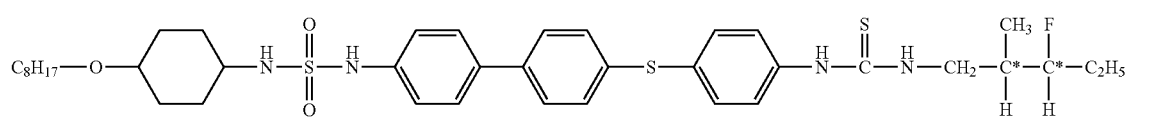
1-36
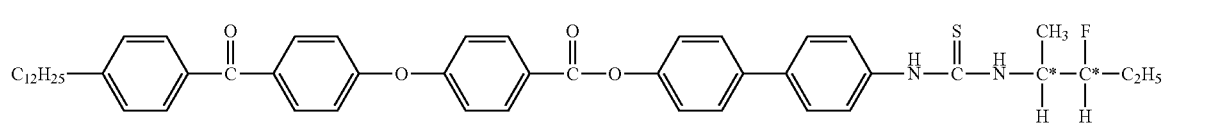
1-37
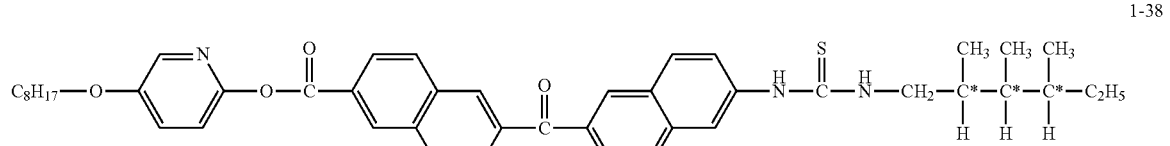
1-38
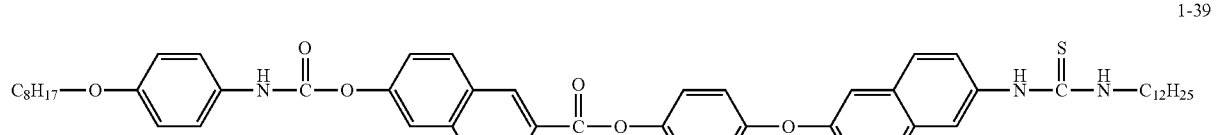
1-39
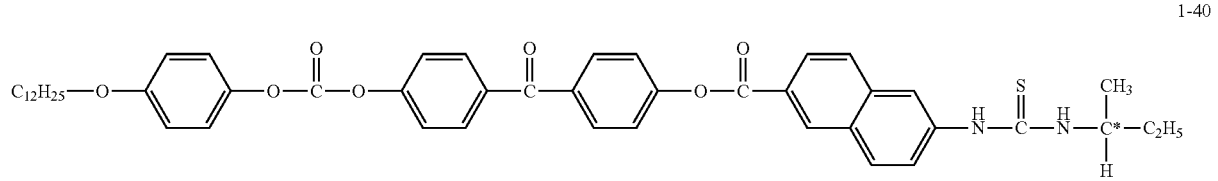
1-40

-continued
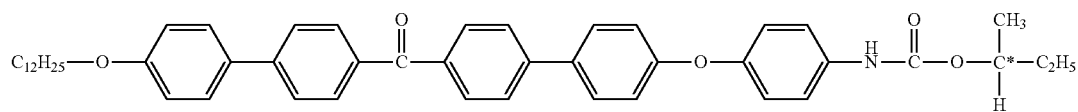
1-41
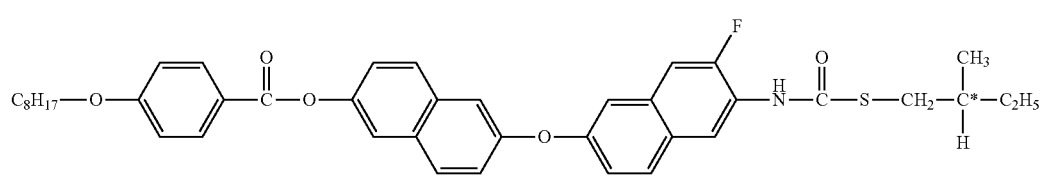
1-42
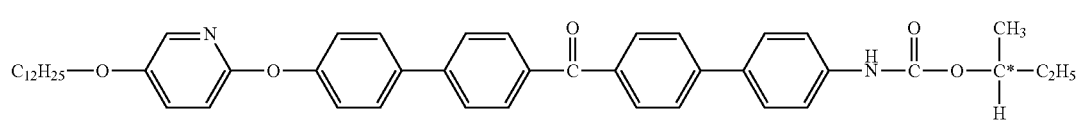
1-43
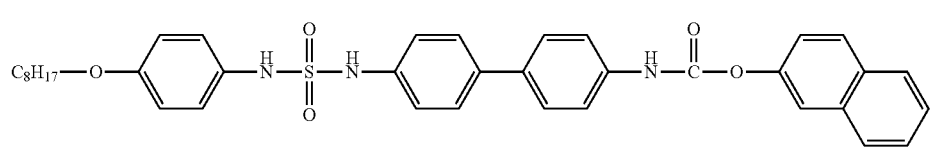
1-44
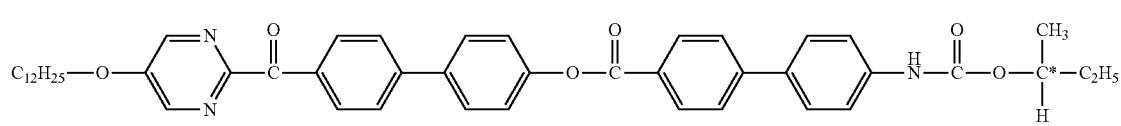
1-45
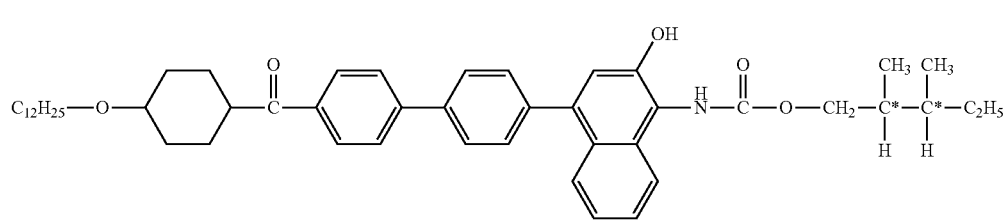
1-46
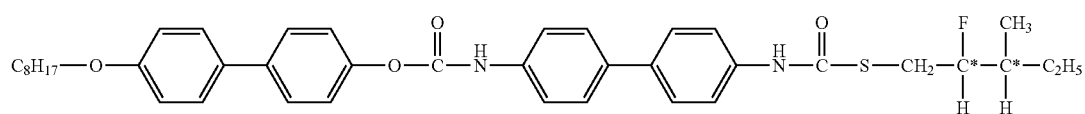
1-47
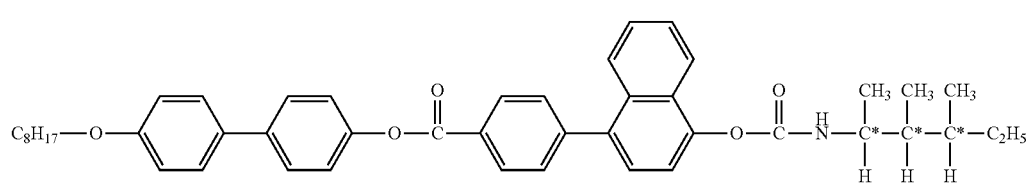
1-48
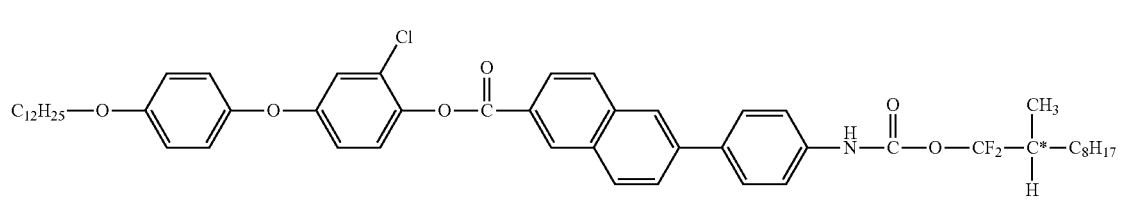
1-49
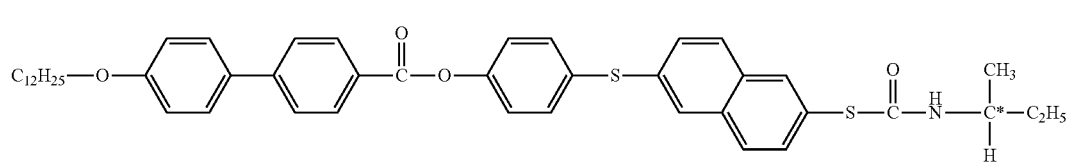
1-50

-continued
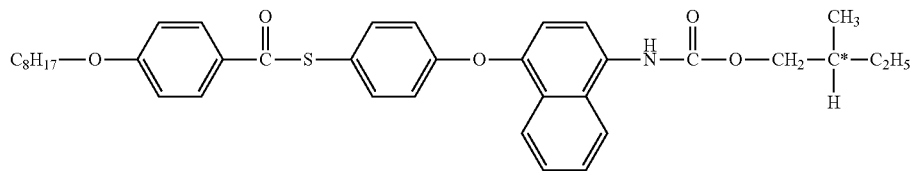
1-51
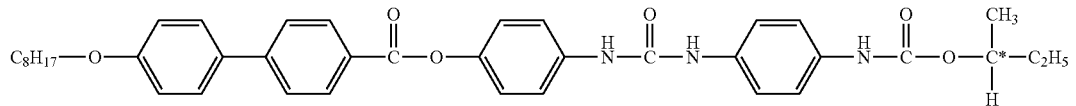
1-52
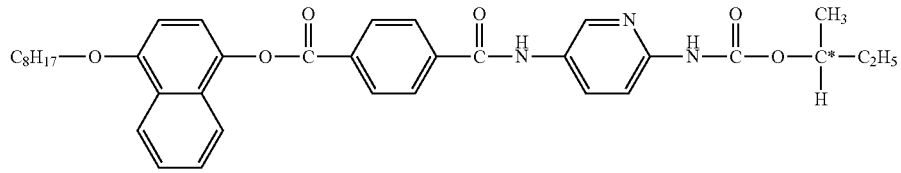
1-53
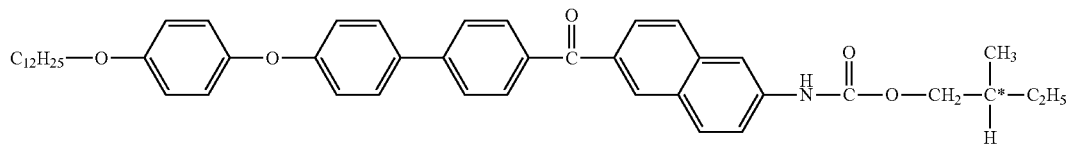
1-54
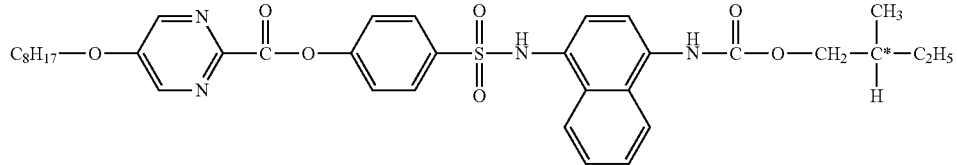
1-55
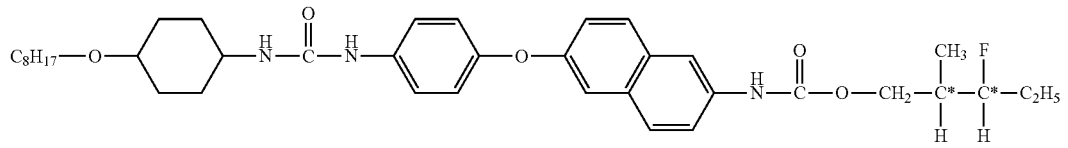
1-56
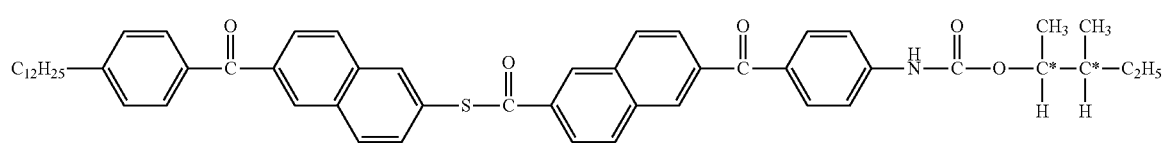
1-57
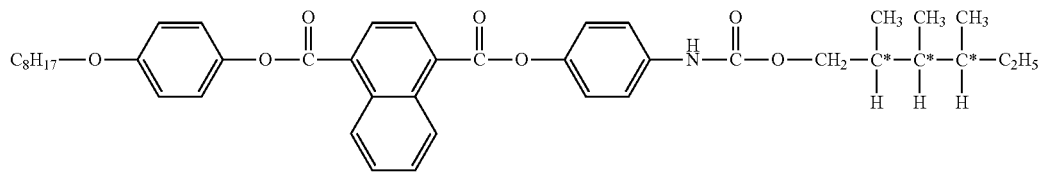
1-58
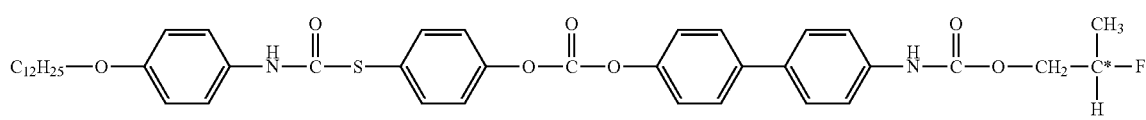
1-59
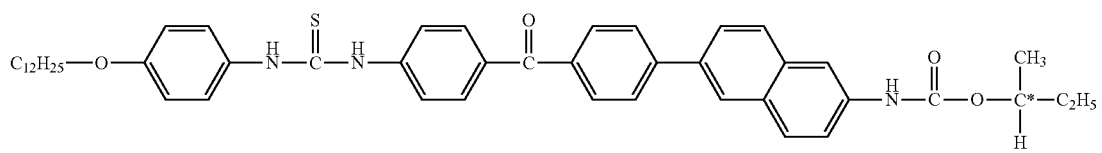
1-60

-continued
1-61
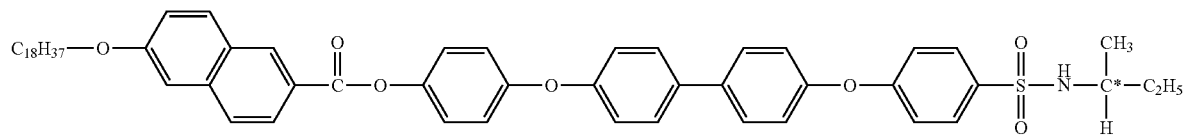
1-62
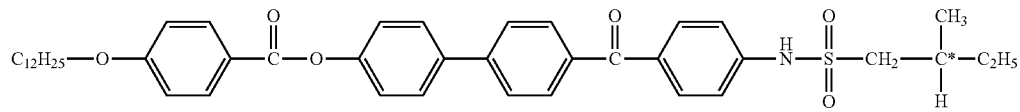
1-63
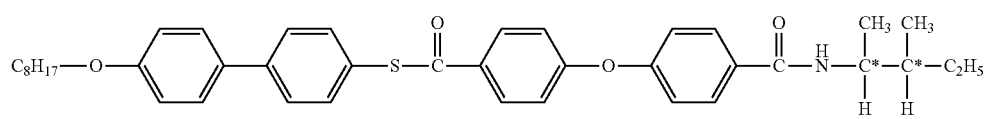
1-64
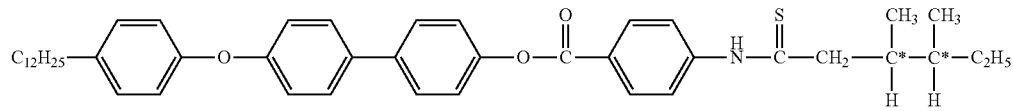
1-65
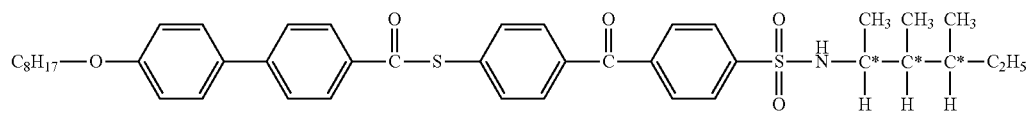
1-66
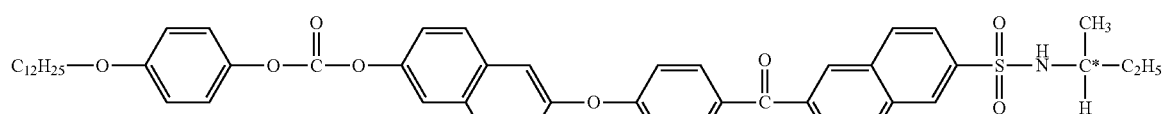
1-67
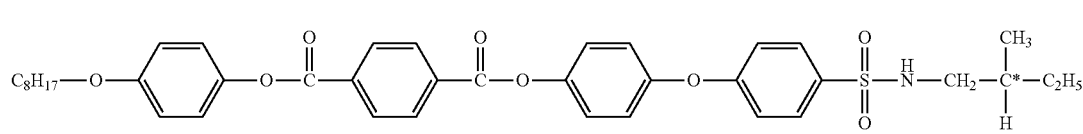
1-68
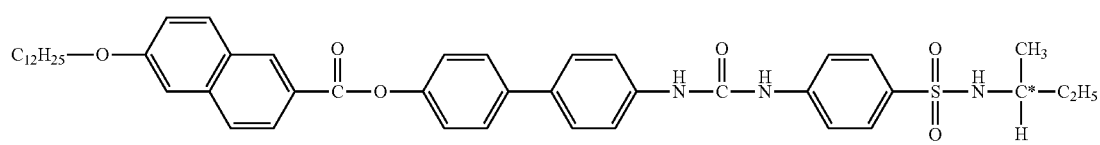
1-69
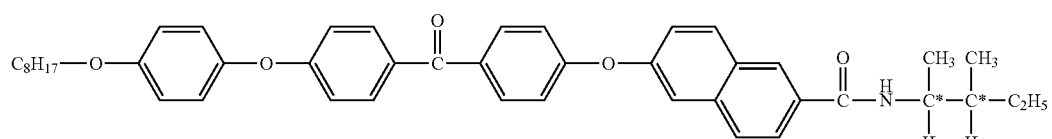
1-70
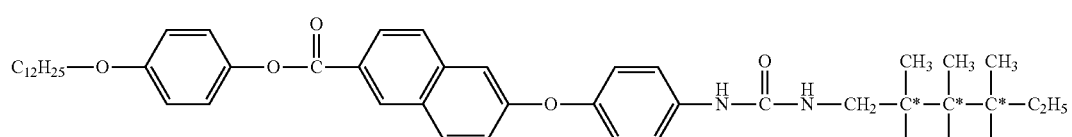
1-71
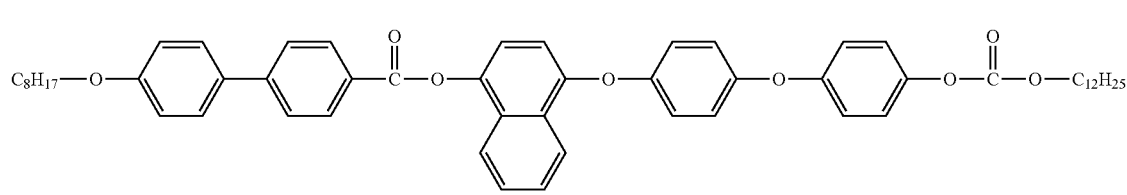

-continued

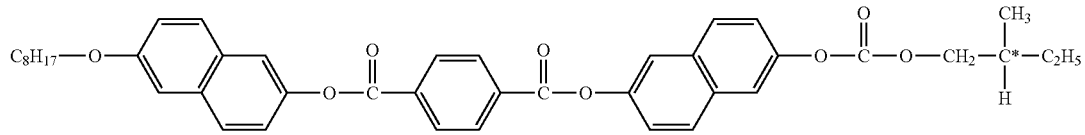

1-72

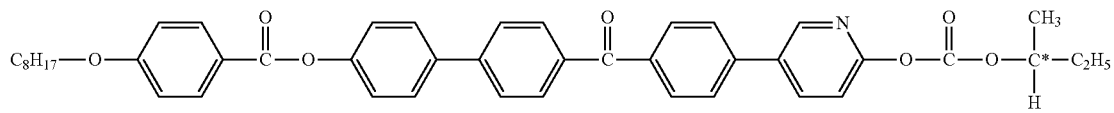

1-73

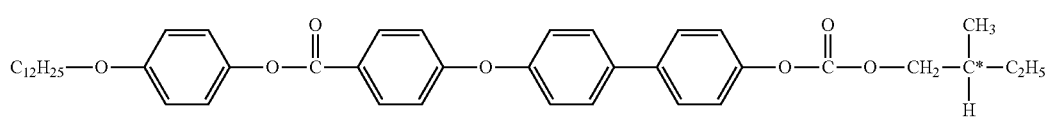

1-74

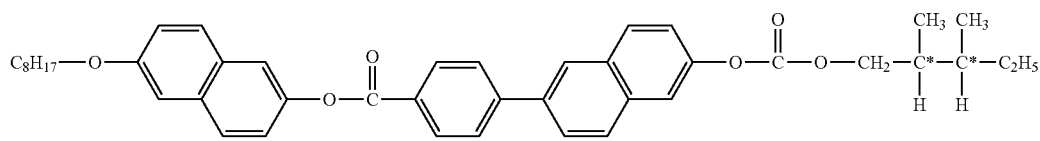

1-75

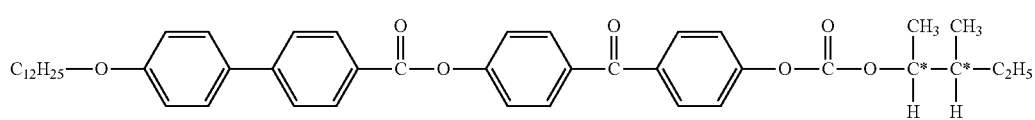

1-76

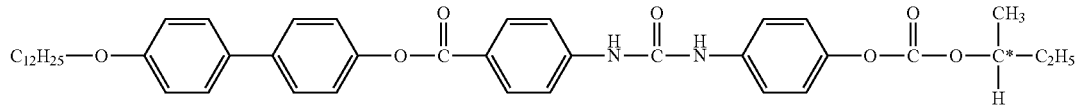

1-77

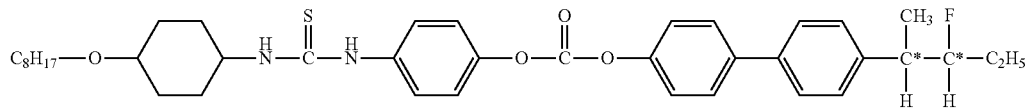

1-78

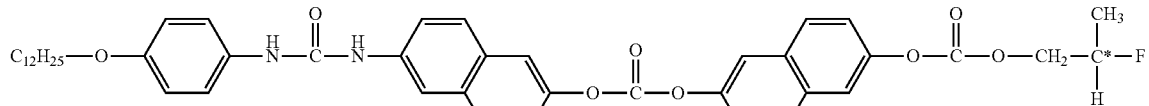

1-79

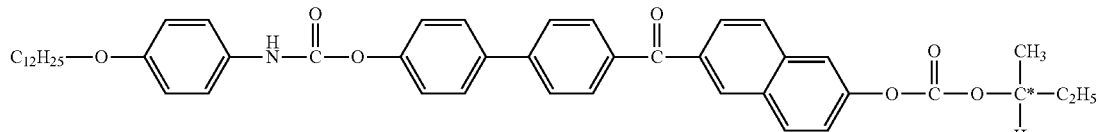

1-80

The compound represented by Formula (1) can be synthesized by a commonly known method. Synthesis thereof can be carried out, referring to methods disclosed in the specifications of Japanese Patent O.P.I. Publication No. 61-47427, Japanese Patent O.P.I. Publication No. 5-119304 and so forth.

<Compound Represented by Formula (2)>

In Formula (2) as a base material made of the foregoing organic polymeric material, $R_{21}$ represents a hydrogen atom or a methyl group. $B_1$ represents an alkylene group or an oxyalkylene group, and $B_2$ represents a mesogenic group. The mesogenic group represented by $B_2$ is synonymous with a mesogenic group represented by $A_1$ in the foregoing Formula (1).

As a specific example of a substituent represented by $Z_2$, exemplified is an example as a specific example of a substituent represented by Z in the foregoing Formula (1). $Z_2$ preferably represents a group containing an asymmetric carbon atom. The group containing an asymmetric carbon atom represented by $Z_2$ is not specifically limited, as long as it is a group containing at least one asymmetric carbon atom, but preferable is a substituent represented by the following Formula (5) or Formula (6).

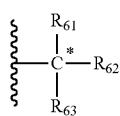

Formula (5)

In Formula (5), symbol * represents an asymmetric carbon atom. Each of $R_{61}$, $R_{62}$ and $R_{63}$ represents a hydrogen atom or a substituent, but there is no case where they are identical to each other. Examples of the substituent represented by each of $R_{61}$, $R_{62}$ and $R_{63}$ include substituents exemplified as specific examples of the substituent represented by each of $R_{41}$, $R_{42}$ and $R_{43}$ in Formula (3).

$R_{61}$ is preferably an alkyl group having 1-6 carbon atoms; more preferably a methyl group, an ethyl group, a trifluoromethyl group or a halogen atom; and still more preferably a methyl group, a trifluoromethyl group or a fluorine atom. $R_{63}$ is preferably a methyl group, an ethyl group, an isopropyl group, an n-butyl group, a tert-butyl group, a hexyl group, an octyl group, a decyl group, a dodecyl group, an octadecyl group, or the like. $R_{63}$ is preferably a hydrogen atom.

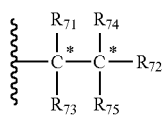

Formula (6)

In Formula (6), symbol * represents an asymmetric carbon atom. Each of $R_{71}$, $R_{72}$, $R_{73}$, $R_{74}$ and $R_{75}$ represents a hydrogen atom or a substituent, but there is no case where $R_{71}$, $R_{72}$, $R_{73}$, $R_{74}$ and $R_{75}$ are identical to each other. Specific examples of the substituent represented by each of $R_{71}$, $R_{72}$, $R_{73}$, $R_{74}$ and $R_{75}$ include substituents exemplified as specific examples of the substituent represented by each of $R_{41}$, $R_{42}$ and $R_{43}$ in Formula (3).

$R_{71}$ is preferably an alkyl group having 1-6 carbon atoms; more preferably a methyl group, an ethyl group, a trifluoromethyl group or a halogen atom; and still more preferably a methyl group, a trifluoromethyl group or a fluorine atom. $R_{72}$ is preferably a methyl group, an ethyl group, an isopropyl group, an n-butyl group, a tert-butyl group, a hexyl group, an octyl group, a decyl group, a dodecyl group, an octadecyl group, or the like. $R_{73}$ is preferably a hydrogen atom. $R_{74}$ is preferably an alkyl group having 1-6 carbon atoms; more preferably a methyl group, an ethyl group, a trifluoromethyl group or a halogen atom; and still more preferably a methyl group, a trifluoromethyl group or a fluorine atom. $R_{75}$ is preferably a hydrogen atom or a fluorine atom.

Compounds each represented by Formula (1) can be synthesized by a commonly known method. As the specific synthetic example, synthesis thereof can be carried out, referring to methods disclosed in the specifications of Japanese Patent O.P.I. Publication No. 2-124995, Japanese Patent O.P.I Publication No. 2-232208, Japanese Patent O.P.I. Publication No. 5-132558 and so forth. Specific examples of compounds each containing at least one kind of repeating units each represented by Formula (2) are exemplified below, but the present invention is not limited thereto.

2-1

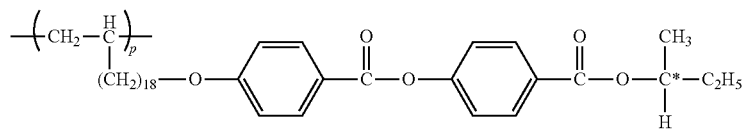

2-2

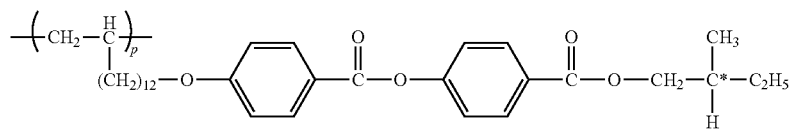

2-3

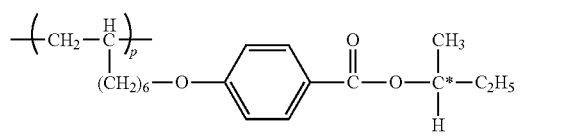

2-4

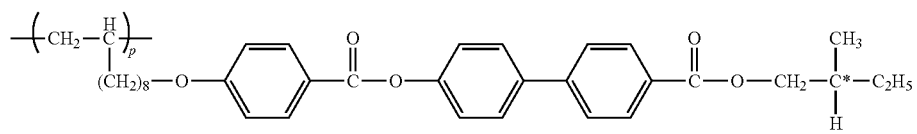

2-5

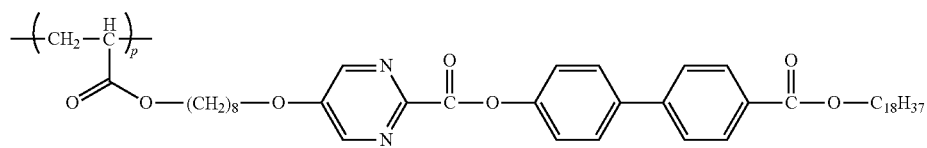

-continued
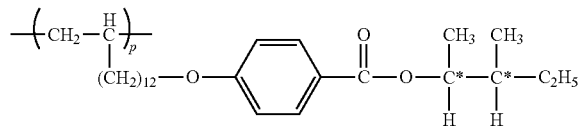 2-6
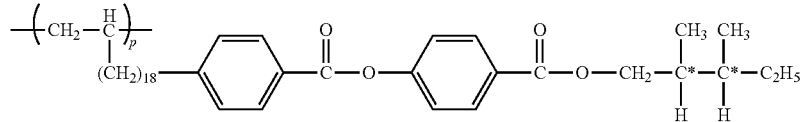 2-7
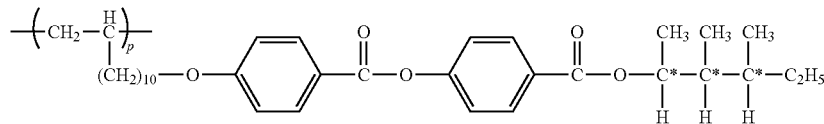 2-8
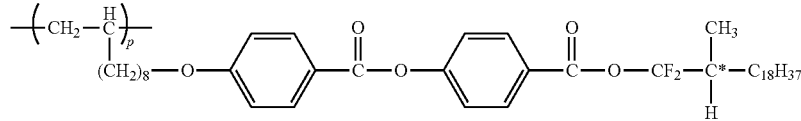 2-9
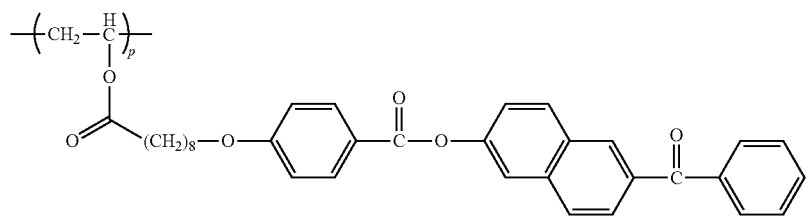 2-10
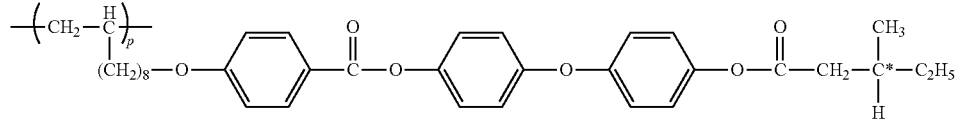 2-11
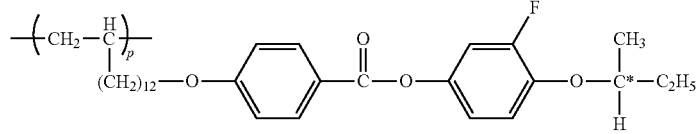 2-12
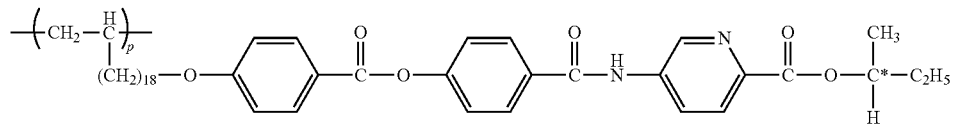 2-13
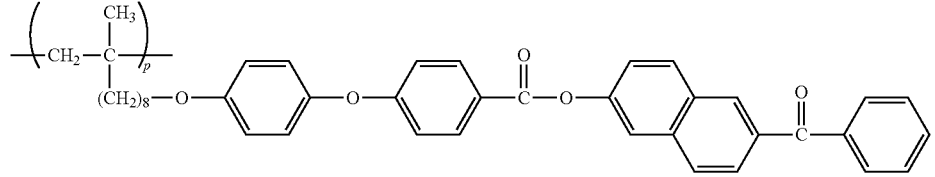 2-14
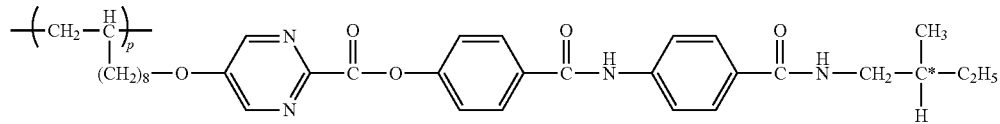 2-15

-continued
2-16
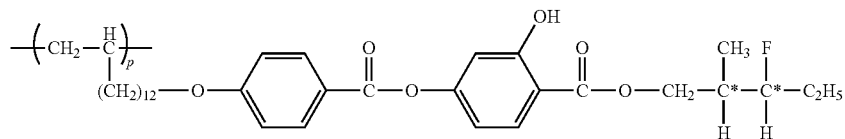
2-17
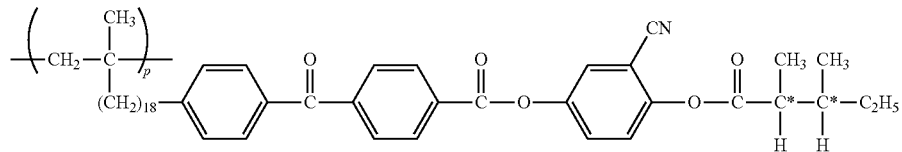
2-18
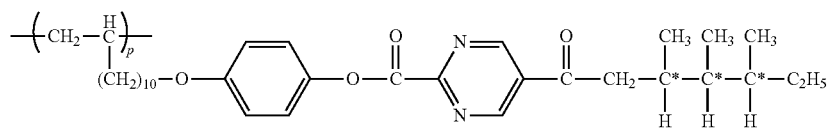
2-19
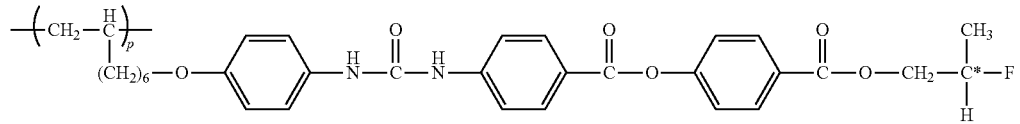
2-20
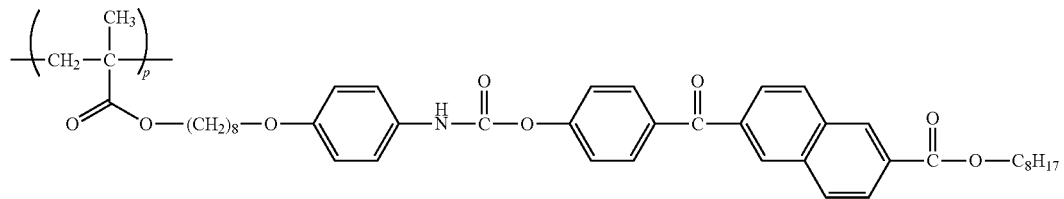
2-21
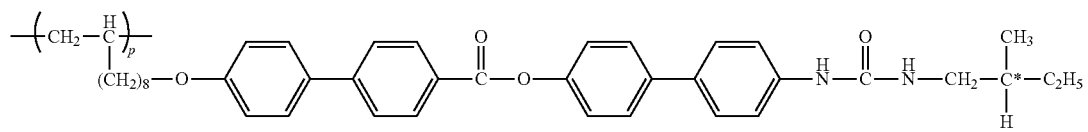
2-22
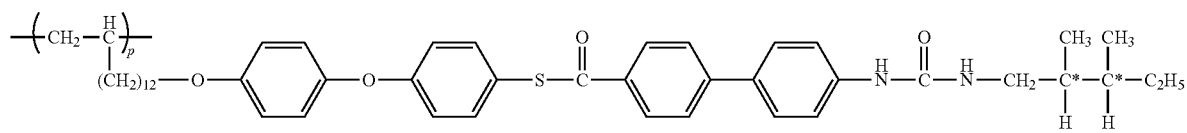
2-23
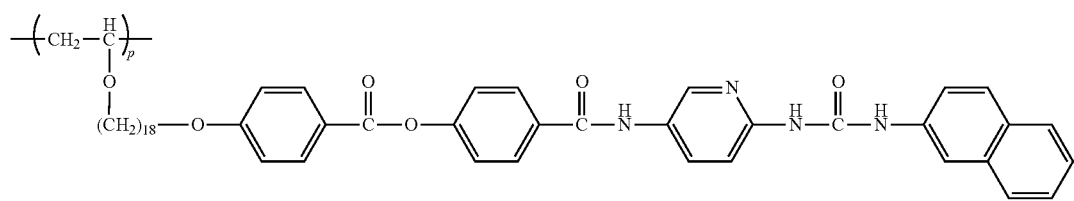
2-24
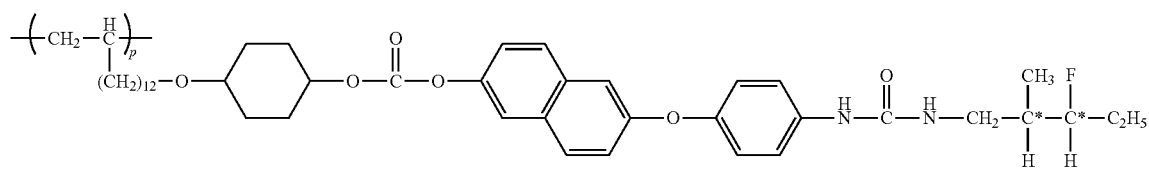

-continued 2-25
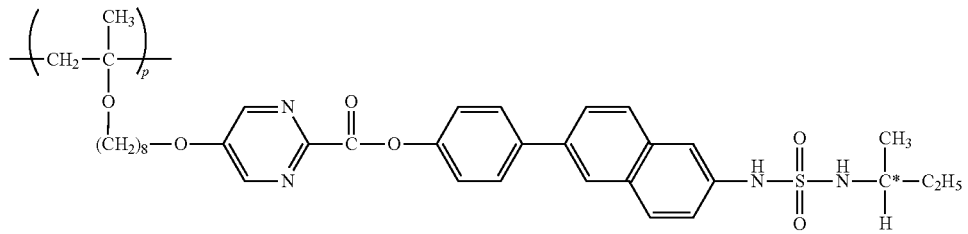

2-26
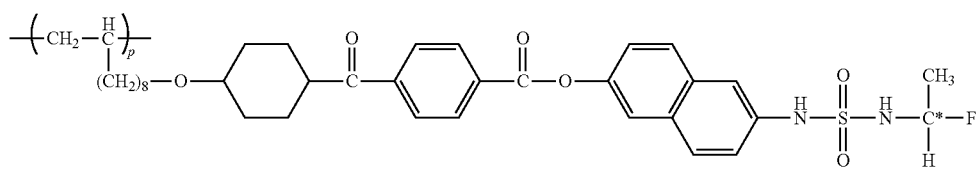

2-27
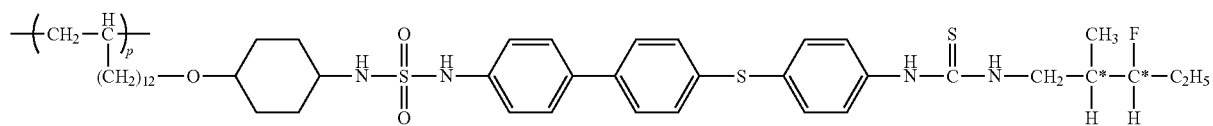

2-28
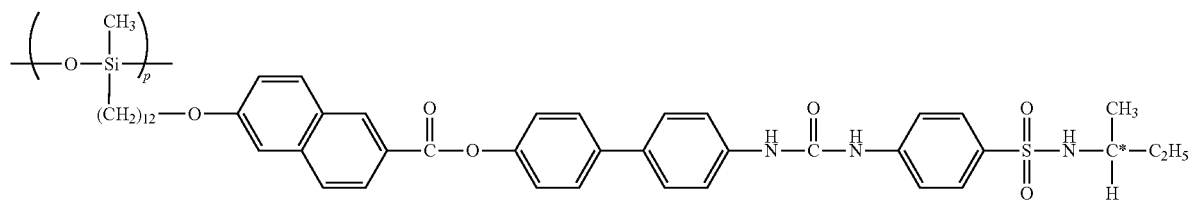

2-29
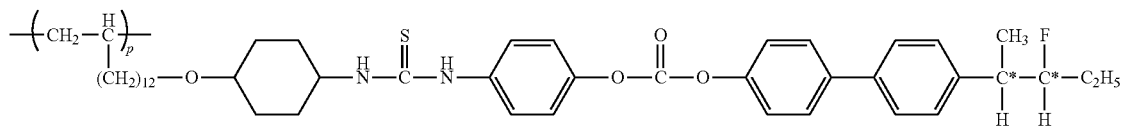

In the present invention, as a mixture ratio of a compound represented by the foregoing Formula (2) to a compound represented by the foregoing Formula (1), the ratio of a compound represented by Formula (2) to a compound represented by Formula (1) is preferably 0-50%, and more preferably 0-30%. In the case of the ratio exceeding 50%, it is undesired because of low orientation together with low piezoelectricity.

An organic piezoelectric material of the present invention contains a compound represented by the foregoing Formula (1) and a base material made of an organic polymeric material, satisfying Expression (1) |C Log P (1)−C Log P (base material)|≤3.0 when C Log P values of the compound and the base material are expressed as C Log P (1) and C Log P (base material), respectively. In addition, an organic piezoelectric material of the present invention contains the compound represented by Formula (1) and a compound represented by the following Formula (2) as the base material made of the organic polymeric material, satisfying Expression (2)|C Log P (1)−C Log P (2)|≤3.0 when a C Log P value of the compound represented by Expression (2) is expressed as C Log P (2). Conventionally, there is an invention in which a low molecular piezoelectric compound (liquid crystal compound) is mixed in a base material to produce a piezoelectric material, but in the case of low compatibility therein, an ultrasound transducer to transmit and receive ultrasound waves generates discontinuous interface and aggregates in the piezoelectric material, whereby reflection and scattering of ultrasound waves are produced, resulting in appearance of fatal flaw. On the other hand, in the case of an ultrasound probe of a type in which each element is laminated in the situation of separation of transmission and reception, adverse effect results since scattering is generated twice when transmitting and receiving ultrasound waves. The present invention has found out in the present invention that high compatibility between the base material and the low molecular compound can solve the above-described problem.

In the present invention, Log P of C Log P is referred to as a coefficient exhibiting affinity of an organic compound with respect to water and 1-octanol. 1-octanol/water partition coefficient P means a ratio of compound equilibrium concentration in each solvent at the partition equilibrium when a slight amount of the compound is dissolved in a solvent made from two liquid phases of 1-octanol and water, as a solute, and it is conventional to be shown in the form of logarithm log P thereof with respect to base 10. Since log P values of a number of compounds have been reported, and many values are seen in a database obtainable from Daylight Chemical Information Systems, Inc. (Daylight CIS) and so forth, these can be cited. When there is no measured log P value, it is most convenient to be calculated with program "CLOGP" obtainable from Daylight CIS.

This program outputs the value of "calculated log P (C log P)" determined via Hansen's and Leo's fragment approach, together with the measured log P value when a measured log P value has been obtained. The fragment approach is based on a chemical structure of a compound, and is disclosed in A. Leo, Comprehensive Medicinal Chemistry, Vol. 4, C. Hansch, P. G. Sammens, J. B. Taylor and C. A. Ramsden, Eds., P. 295, Pergamon Press, 1990 as a reference document taking into account a type of the number of atoms and chemical bond. Since this C log P value is most versatile, and is a reliable estimate value, it is usable in place of the measured log P value during selection of a compound. In the present invention, when there was a measured log P value, the value was used, and when there was no measured log P value, C log P calculated via program CLOGP v4.01 was used.

Further, as to Formula (2) as a base material made of an organic polymeric material, when its unit structure had a molecular weight of 500 or more, a value calculated via only the unit structure (monomer) was used, and when its unit structure had a molecular weight of 500 or less, a value calculated via a polymer having the molecular weight exceeding 500 was used.

<Organic Piezoelectric Material>

The organic piezoelectric material of the present invention can form an organic piezoelectric material film by forming a film containing a compound represented by Formula (1); by forming a film containing a compound represented by Formula (1) and a compound represented by Formula (2); or further polarization to the foregoing film.

When stress is applied to a piezoelectric material film, a phenomenon referred to as a so-called electrical polarization by which opposite charges appear on both end faces of the piezoelectric material film in proportion to the applied stress, and on the contrary, when a piezoelectric material is placed in electric field (electric field application), the organic piezoelectric material film exhibits a property (piezoelectric performance) in which strain is generated in proportion to the applied electric field. Specifically, in the case of an organic piezoelectric material film made of an organic piezoelectric material of the present invention, a large piezoelectric effect appears via polarization caused by orientation-freezing of the dipole moment in the main and side chains of a polymer.

When the piezoelectric material film is subjected to application of energy (heat), in response to this, a level of spontaneous polarization inside the piezoelectric material film is changed. In this case, since surface charge present on the surface of the piezoelectric material film so as to neutralize the spontaneous polarization can nor respond to energy change so quickly as the above-described polarization, charge is to be present on the surface of the piezoelectric material film by an amount equivalent to the charge for a short period of time. Generation of electricity in response to this energy change is called pyroelectricity, but specifically in the case of the organic piezoelectric material film made of an organic piezoelectric material, large pyroelectric performance is produced via polarization caused by orientation-freezing of dipole moment in the main and side chains of a polymer.

(Method of Forming Organic Piezoelectric Material Film)

In order to form an organic piezoelectric material film, it is preferred to form a film via coating. Examples of the coating method include a spin coating method, a solvent cast method, a melt cast method, a melt pressing method, a roll coating method, a flow coating method, a printing method, a dip coating method, a bar coating method and so forth.

Coating or film formation is preferably conducted in the temperature range where a compound represented by Formula (1) exhibits a liquid crystal phase, and is also preferably conducted in the temperature range where a compound represented by Formula (2) exhibits a liquid crystal phase. In addition, the resulting film may be further subjected to the after-mentioned polarization.

When film-forming a compound represented by Formula (1) on the organic piezoelectric film, a film formation property may be improved via mixture of an arbitrary non-liquid crystal polymeric compound. As a non-liquid crystal polymeric compound, a thermoplastic resin, a thermosetting resin or a photo-curable resin having a number average molecular weight of 1500 or more is specifically employed.

As the base material formed of an organic polymeric material of the present invention, a compound represented by Formula (2) or a thermoplastic material is cited. The thermoplastic resin is usable without any limitation, as long as it has a number average molecular weight of 1500 or more, and preferably has a number average molecular weight of 1500-100000. In the case of the thermoplastic resin having a number average molecular weight of less than 1500, the glass transition temperature is too low, whereby mechanical stability of the organic piezoelectric material film tends to be lowered.

Specific examples of thermoplastic resins preferably utilized for the present invention include a halogenated vinyl polymer or copolymer such as polyvinyl chloride, polyvinyl bromide, polyvinyl fluoride, a vinyl chloride-vinyl acetate copolymer, a vinyl chloride-ethylene copolymer, a vinyl chloride-propylene copolymer, a vinyl chloride-vinylidene chloride copolymer, a vinyl chloride-butadiene copolymer, a vinyl chloride-acrylic acid ester copolymer, a vinyl chloride-acrylonitrile copolymer, a vinyl chloride-acrylonitrile copolymer, a vinyl chloride-stylene-acrylonitrile terpolymer, a vinyl chloride-vinylidene chloride-vinyl acetate terpolymer, a polyvinylidene chloride, polytetrafluoroethylene, polytetrafluorochloroethylene or polyvinylidene fluoride; a polymer or copolymer of unsaturated alcohol or ether such as polyvinyl alcohol, polyallyl alcohol, polyvinyl ether or polyallyl ether, a polymer or copolymer of an unsaturated carboxylic acid such as an acrylic acid or a methacrylic acid; a polymer or a copolymer of one having an unsaturated bond in a polyacrylic acid ester such as polyvinyl ester such as polyvinyl acetate or the like, or polyallyl ester such as a polyphthalic acid or the like; a polymer or copolymer having an unsaturated bond in an acidic residue of a polymer of polyacrylic acid ester, polymethacrylic acid ester, maleic acid ester or fumaric acid ester, or in an acidic residue and an alcohol residue; an unsaturated nitrite polymer or copolymer such as a polymer or copolymer of acrylonitrile or methacrylonitrile, polyvinylidene cyanide, or a polymer or copolymer of malononitrile or fumaronitrile; a polymer or copolymer of an aromatic vinyl compound such as polystyrene, poly-α-methylstyrene, a poly-p-methystyrene copolymer, polyvinyl benzene or polystyrene halide; a polymer or copolymer of a heterocyclic compound such as polyvinyl pyridine, poly-N-vinyl pyrrolidine, or poly-N-vinyl pyrrolidone; a polyester condensate such as polycarbonate; a polyamide condensate such as nylon 6 or nylon 6,6; a heat-resistant organic polymer such as polyamideimide, polyetherimide, polyamide, polyphenylene oxide, polyphenylene sulfide, polysulfone, polyethersulfone or polyarylate; and so forth. Of these, polycarbonate, polystyrene, polyacrylate, polymethacrylate and nylon are preferably usable.

As the thermosetting resin, usable are various kinds including those commercially available such as epoxy based additives, acrylic additives, and so forth. As the photo-curable resin, usable are various kinds including those commercially available such as additives to be cured by visible light, UV light or electron beams. These non-liquid crystal polymeric materials may be appropriately selected in view of methods of manufacturing the organic piezoelectric material film, and durability in demand.

Specific examples of thermally curable or photo-curable resins suitably employed in the present invention include epoxy based additives, acrylic additives, unsaturated polymer based additives, polyurethane based additives, hot-melt type additives, and elastomer type additives.

Preferable examples of the epoxy based additives include those of bisphenol A type as a main agent. The main agent in which a part of bisphenol A is set to each of the following bisphenol compounds is usable.

Examples of the polyurethane based adhesive include as an isocyanate component, methylene bis(p-phenylene diisocyanate), tolylene diisocyanate, hexamethlene diisocyanate, 1-chlorophenyl diisocyanate, 1,5-naphthylene diisocyanate, thiodipropyl diisocyanate, ethylbenzene-α-2-di-isocyanate, 4,4,4-triphenylmethane triisocyanate or the like, and as a component reacted with it, ethylene glycol, propylene glycol, triethylene glycol, tetraethylene glycol, glycerol, hexane triol, xylylene diol, lauric acid monoglyceride, stearic acid monoglyceride, oleic acid monoglyceride, polyethylene glycol, polypropylene glycol, polyester, polyamide or the like.

A non-liquid crystal polymeric material has an amount of 2-40% by weight, based on a compound represented by Formula (1), and preferably has an amount of 2-20% by weight. In the case of the non-liquid crystal polymeric material having an amount of less than 2% by weight, a liquid crystal layer exhibits lowered film formation property of the liquid crystal layer, and tends to exhibit insufficient mechanical strength thereof. On the other hand, in the case of the non-liquid crystal polymeric material exceeding an amount of 40% by weight, undesired light scattering tends to be produced, resulting in lowering of performance of the organic piezoelectric material film.

(Polarization)

As a polarization method in the polarization relating to the present invention, conventionally known methods are applicable.

For example, in the case of a method of conducting a corona discharge treatment, the corona discharge treatment can be carried out employing an apparatus equipped with a commercially available high voltage power supply and electrodes.

Since discharging conditions depend on a device or a treatment environment, it is desirable to select a suitable condition, but the high voltage power supply preferably has a voltage of from −1 to −20 kV, a current of 1-80 mA, a distance between electrodes of 1-10 cm, and an applied voltage of 0.5-2.0 MV/m.

The electrode is preferably a needle-shaped electrode, a linear electrode (wire electrode), or an electrode in the form of a net which have been conventionally used, but the present invention is not limited thereto.

Further, since heating is conducted during corona discharge, a heater should be placed in the lower portion of an electrode with which a substrate prepared in the present invention is brought into contact, via an insulator.

In addition, when in the present invention, a corona discharge treatment as a polarization in the situation where a solvent in a coating solution remains, the treatment should be carried out while sufficiently ventilating in such a way that a volatile component of the solvent is removed from the solution in order to avoid risk such as ignitable explosion or the like, for safety.

(Substrate)

As a substrate, selection of the substrate depends on applications, a method of using the substrate and so forth of an organic piezoelectric material film relating to the present invention. Examples of the substrate include a plastic plate or film made of polyimide, polyamide, polyimideamide, polyethylene terephthalate (PET), polyethylene naphthalate (PEN), polymethyl methacrylate (PMMA), a polycarbonate resin or cycloolefin polymer. Further, the surface of the foregoing substrate material may be covered with aluminum, gold, copper, magnesium, silicon or the like. Furthermore, the substrate may be a plate or film made of aluminum, gold, copper, magnesium, silicon as a simple substance, or a single crystal of halide of rare earth elements.

Further, it may be formed on a multilayer piezoelectric element. As a method of using a multilayer in which piezoelectric elements are laminated, there is a method by which organic piezoelectric material films of the present invention each are layered on a ceramic piezoelectric element. PZT is used as the ceramic piezoelectric element, but in recent years, those containing no lead have been recommended.

PZT is preferably in the range of the following formula; $Pb(Zr_{1-x}T_x)O_3$ ($0.47 \leq x \leq 1$). Examples of those containing no lead include natural or artificial quartz, lithium niobate ($LiNbO_3$), potassium tantalate niobate [$K(Ta, Nb)O_3$], barium titanate ($BaTiO_3$), lithium tantalate ($LiTaO_3$), strontium titanate ($SrTiO_3$) and so forth. As to various ceramic materials, the composition can be appropriately selected depending on performance at a time when using each of them.

<Ultrasound Transducer>

It is a feature in the present invention that an organic piezoelectric material film formed of an organic piezoelectric material of the present invention is used for an ultrasound transducer. The ultrasound transducer is preferably allowed to be an ultrasound transducer for reception which is used for a transducer for ultrasound transmission, and a probe for diagnostic ultrasound systems equipped with the transducer for ultrasound transmission.

Incidentally, the ultrasound transducer is conventionally constituted by arranging a pair of electrodes sandwiching a layer (or a film) formed of a film-shaped piezoelectric material (referred to also as "piezoelectric film", "piezoelectric material film" or "piezoelectric material layer") between them, and then plural ultrasound probes are one-dimensionally arranged to be placed to constitute an ultrasound probe.

The predetermined number of transducers in the long axis direction in which plural transducers are arranged to be placed are provided as apertures, and thereby a function is performed in which plural transducers belonging to the apertures are driven; and ultrasound beams are focused on a measurement portion in an object for irradiation; and ultrasound reflection echo emitted from the object or the like is also received by plural transducers belonging to the apertures to be converted into an electrical signal.

Next, each of a transducer for ultrasound reception and a transducer for ultrasound transmission in the present invention will be described in detail.

<Transducer for Ultrasound Reception>

A transducer for ultrasound reception of the present invention is a transducer used for a probe for diagnostic ultrasound systems, and it is a feature that an organic piezoelectric material is used as a piezoelectric material constituting the transducer to form an organic piezoelectric material film.

In addition, an organic piezoelectric material or an organic piezoelectric material film used for a transducer for ultrasound reception preferably has a specific dielectric constant of 10-50 in the thickness resonance frequency. Adjustment of the specific dielectric constant can be made via adjustment of the number, the composition and the polymerization degree polar functional groups such as the foregoing substituent R, a $CF_2$ group, and a CN group contained in a compound constituting the organic piezoelectric material, and via the above-described polarization.

<Transducer for Ultrasound Transmission>

A transducer for ultrasound transmission relating to the present invention is preferably formed of a piezoelectric material having an appropriate specific dielectric constant in the relationship with the above-described transducer for reception. Further, a piezoelectric material exhibiting excellent heat resistance and voltage resistance is preferably used.

As a material constituting a transducer for ultrasound transmission, usable are various commonly known organic piezoelectric materials and inorganic piezoelectric materials.

As an organic piezoelectric material, usable is a polymeric material similar to an organic piezoelectric material constituting the above-described transducer for ultrasound reception.

Usable examples of the inorganic piezoelectric material include quartz, lithium niobate ($LiNbO_3$), potassium tantalate niobate [$K(Ta, Nb)O_3$], barium titanate ($BaTiO_3$), lithium tantalate ($LiTaO_3$), lead titanate zirconate (PZT), strontium titanate ($SrTiO_3$), barium strontium titanate (BTS) and so forth. In addition, PZT is preferably $Pb(Zr_{1-n}Ti_n)O_3$ ($0.47 \leq n \leq 1$).

<Electrode>

A piezoelectric (material) transducer relating to the present invention is produced in such a manner that an electrode is formed on both sides or one side of a piezoelectric material film (layer), and prepared by polarization for the piezoelectric material film. The electrode is formed employing an electrode material such as gold (Au), platinum (Pt), silver (Ag), palladium (Pd), copper (Cu), nickel (Ni), Tin (Sn), aluminum (AT) or the like as a main material.

During formation of an electrode, a base metal such as titanium (Ti), chromium (Cr) or the Eke is first formed by a sputtering method so as to give a thickness of 0.02-1.0 μm, and thereafter a metal material formed of a metal containing the above-described metal element as a main element, or an alloy thereof, and an insulating material as a part if desired are formed by a sputtering method or another appropriate method so as to give a thickness of 1-10 μm. Conductive paste in which fine-powdered metal powder and low melting point glass are mixed is subjected to screen printing a dipping method, or a spraying method other than the sputtering method to form these electrodes. Further, a predetermined voltage is supplied between the electrodes formed on both sides of a piezoelectric material film, and the piezoelectric material film is polarized to obtain a piezoelectric element.

(Ultrasound Probe)

An ultrasound probe relating to the present invention is a probe for diagnostic ultrasound systems equipped with a transducer for ultrasound transmission and a transducer for ultrasound reception, and it is a feature that the above-described transducer for ultrasound reception relating to the present invention is used as a transducer for reception.

In the present invention, only a single transducer may play a role for both transmission and reception of ultrasound waves. However, more preferably, a transducer for transmission and a transducer for reception are separately formed in a probe.

A piezoelectric material constituting a transducer for reception may be any of a commonly known ceramics inorganic piezoelectric material and an organic piezoelectric material.

In an ultrasound probe relating to the present invention, the ultrasound receiving transducer of the present invention can be arranged to be placed on a transducer for transmission or in parallel to the transducer for transmission.

As a more preferred embodiment, a constitution is preferable in which the transducer for ultrasound reception of the present invention is laminated on a transducer for ultrasound transmission. In this case, the transducer for ultrasound reception of the present invention may be laminated on the transducer for ultrasound transmission via attachment onto another polymeric material (the above-described polymer (resin) film having relatively small specific dielectric constant serving as a support, for example, polyester film). In such a case, the total thickness of the transducer for reception together with another polymeric material should be preferably adjusted to a preferable receiving frequency band from the viewpoint of probe designing. In view of diagnostic ultrasound systems and an actual frequency band for living body information collection, the thickness is preferably 40-150 μm.

In addition, a backing layer, an acoustic matching layer and an acoustic lens may be provided in the probe. Further, transducers each made of a large number of piezoelectric materials may be two-dimensionally arranged to form a prove. A constitution as a scanner may be utilized to sequentially scan a plurality of two-dimensionally arranged probes for imaging.

Since difference between acoustic impedance of an ultrasound transducer and acoustic impedance of living body tissues is large, reflection at the interface becomes large, whereby free oscillation lasts longer. In order to correct this, a matching layer having medium acoustic impedance to both of the foregoing acoustic impedances is introduced between the ultrasound transducer and the living body tissues. By doing this, reflection is reduced to smoothly restore the free oscillation, and the ultrasound wave pulse width transmitted and received by a probe is shortened, whereby ultrasound waves are effectively propagated inside the living body.

Usable examples of a material used for an acoustic matching layer include aluminum, an aluminum alloy (for example, an Al—Mg alloy), a magnesium alloy, a Macor glass, glass, fused quartz, carbon graphite, copper graphite, polyethylene (PE), polypropylene (PP), polycarbonate (PC), an ABC resin, polyphenylene ether (PPE), an ABS resin, an AAS resin, an AES resin, nylon (PA6, PA6-6), PPO (polyphenylene oxide), PPS (polyphenylene sulfide: those containing glass fibers which are also allowed to be used), PPE (polyphenylene ether), PEEK (polyetherether ketone), PAI (polycarbonate), an epoxy resin, a urethane resin, or the like). Preferably usable are those molded by mixing zinc ointment, titanium oxide, silica, alumina, red iron oxide, ferrite, tungsten oxide, ytterbium oxide, barium sulfate, tungsten, molybdenum or the like as a filler in a thermosetting resin such as an epoxy resin or the like.

An acoustic matching layer may be composed of a single layer, or plural layers, but is preferably composed of at least two layers. The acoustic matching layer should be designed to have a thickness of $\lambda/4$, when a wavelength of ultrasound waves is designated as $\lambda$. When this is not satisfied, undesired plural spurious ones are generated at a point of frequency different from the original resonance frequency, whereby the basic acoustic characteristic tends to be largely varied. As a result, since increase of echo duration, and reduction of sensitivity and S/N caused by waveform distortion of reflection echo are produced, these are not desirable. Such a usable acoustic matching layer has a total thickness of roughly 30-500 μm.

(Backing Layer)

In the present invention, a backing layer placed on the reverse side of an ultrasound transducer is also preferably provided in order to prevent backward propagation of ultrasound waves. By doing this, the pulse width can be shortened. The backing layer supports a piezoelectric element, and is an absorber capable of absorbing undesired ultrasound waves. Usable examples of a backing material used for the backing layer include a material press-molded by mixing powder of tungsten oxide, titanium oxide, ferrite or the like in natural rubber, ferrite rubber or an epoxy resin, and thermoplastic resins such as vinyl chloride, polyvinyl butyral (PVB), an ABS resin, polyurethane (PUR), polyvinyl alcohol (PVAL), polyethylene (PE), polypropylene (PP), polyacetal (POM), polyethylene terephthalate (PETP), a fluorine resin (PTFE), polyethylene glycol, a polyethylene terephthalate-polyethylene glycol copolymer, and so forth.

The backing material is preferably one made of a rubber based composite material and/or an epoxy resin composite material, and shape thereof can be appropriately selected depending on the piezoelectric material and head shape of a probe possessing the piezoelectric material.

The rubber based composite material is preferably a material containing a rubber component and a filler and having hardness from A70 with a type A durometer to D70 with a type D durometer employing a spring type hardness tester (durometer hardness) in accordance with JIS K625, and addition of a compounding agent is further allowed, if necessary. Preferable examples of rubber components include ethylene propylene rubber (EPDM or EPM), hydronitrile rubber (HNBR), chloroprene (CR), silicone rubber, a rubber blend of EPDM with HNBR, a rubber blend of EPDM with nitrile rubber (NBR), a rubber blend of high styrene rubber with NBR and/or HNBR, a rubber blend of EPDM with HSR, and so forth. More preferable examples thereof include ethylene propylene rubber (EPDM or EPM), hydronitrile rubber (HNBR), a rubber blend of EPDM with HNBR, a rubber blend of EPDM with nitrile rubber (NBR),), a rubber blend of high styrene rubber with NBR and/or HNBR, a rubber blend of EPDM with HSR, and so forth. As a rubber component of the present invention, one kind of rubber component such as vulcanized rubber, thermoplastic elastomer or the like may be used singly, but a rubber blend in which at least two kinds of rubber components are blended as a rubber blend may also be used. A filler to be added into a rubber component can be selected in various forms from those conventionally used to those having specific gravity, together with blended quantity. Examples thereof include metal oxide such as zinc ointment, titanium white, red iron oxide, ferrite, alumina, tungsten trioxide, ytterbium or the like, clay such as calcium carbonate, hard clay, diatomaceous earth or the like, metal salts such as calcium carbonate, barium sulfate and so forth, glass powder, various kinds of metal based fine powder such as tungsten, molybdenum and so forth, and various balloons such as glass balloon, polymer balloon and so forth. Each of these fillers can be added in various ratios, but the filler preferably has a content of 50-3000 parts by weight, based on 100 parts by weight of rubber component, more preferably has a content of 100-2000 parts by weight, and still more preferably has a content of roughly 300-1500 parts by weight. Further, these fillers used singly or in combination with at least two kinds may be added.

Further, another compounding agent can be added into a rubber based composite material, and examples of such a compounding agent include a vulcanizing agent, a crosslinking agent, a hardener, their auxiliary agent, a degradation inhibitor, an antioxidant, a colorant and so forth. For example, carbon black, silicon dioxide, process oil, sulfur (vulcanizing agent), dicumyl peroxide (Dicup, crosslinking agent), a stearic acid and so forth each can be blended. Each of these compounding agents is used, if needed, but the consumption amount is generally about 1-100 parts by weight, based on 100 parts by weight of rubber component, but is appropriately changeable depending on the total balance and properties.

The epoxy resin composite material preferably contains an epoxy resin compound and a filler, various compounding agents each can be further added, if needed. Examples of the epoxy resin component include a novolac-type epoxy resin such as a bisphenol A type, a bisphenol F type, a resol novolac-type, a phenol-modified novolac-type or the like, a polycyclic aromatic type epoxy resin such as a naphthalene structure-containing type, an anthracene structure-containing type, a fluorene structure-containing type or the like, a hydrogenated alicyclic epoxy resin, a liquid crystal epoxy resin, and so forth. The epoxy resin component of the present invention may be used singly, but at least two kinds of epoxy resin components may be mixed to be used as a blending resin.

As a filler to be added into an epoxy component, preferably usable is any of those from the same one as a filler to be mixed in the above-described rubber component to composite particles prepared via pulverization of the above-described rubber based combined agent. As composite particles, provided can be particles in which those obtained by filling ferrite in silicone rubber have been pulverized by a crusher to have a particle diameter of approximately 200 μm.

When using an epoxy resin complex, a crosslinking agent should be further added therein, and examples thereof include chain aliphatic polyamine such as diethylene triamine, triethylene tetramine, dipropylene diamine, diethylaminopropylamine or the like; aromatic amine such as N-aminoethylpiperazine, mensendiamine, isoholondiamine, diaminodiphenylmethane, diaminodiphenylsulfone or the like; secondary or tertiary amine such as a polyamide resin piperidine, NN-dimethylpiperazine, triethylenediamine, 2,4,6-tris(dimethylaminomethyl) phenol, benzildimethylamine, 2-(dimethylaminomethyl) phenol or the like; imidazole such as 2-methylimidazole, 2-ethylimidazole, 1-cyanoethyl-2-undecylimidazolium.trimellitate or the like; and acid anhydride such as liquid polymercaptan, polysulfide, phthalic anhydride, trimellitic anhydride, methyltetrahydrophthalic anhydride, methyl endo methylenetetrahydrophthalic anhydride, methylbutenyltetrahydrophthalic anhydride, methylhexahydrophthalic anhydride or the like.

The backing material preferably has a thickness of roughly 1-10 mm, and preferably has a thickness of roughly 1-5 mm.

(Acoustic Lens)

An acoustic lens in the present invention is provided to improve resolution via collection of ultrasound wave beams by utilizing refraction. It is a feature in the present invention that a material producing luminescence via exposure to exciting light, that is, a light-emitting material is added in a region close to the object surface of the acoustic lens.

It is necessary for the acoustic lens that the acoustic lens collects ultrasound waves and adheres well to a living body to fit together with an acoustic impedance of the living body (density×sound velocity: $1.4 \times 10^6$-$1.6 \times 10^6$ kg/m²·sec), whereby reflection of ultrasound waves is possible to be reduced, and that ultrasound attenuation of the lens itself is small.

That is, an acoustic lens in which a polymeric material such as conventional rubber or the like as a base is prepared is provided in a portion brought into contact with a human body in order to collect ultrasound wave beams. As a lens material to be used herein, desirable are those in which the sound velocity is sufficiently smaller than that of a human body, together with reduced attenuation thereof, and the acoustic impedance is close to that of the human skin. The reason is that when sound velocity of the lens material is smaller than that of a human body, the form of a lens can be convex, whereby smoothness is to be improved during diagnosis which is safely done; further, when attenuation thereof is reduced, ultrasound waves are sensitively transmitted and received; and further, when the acoustic impedance is close to that of the human skin, reflection is reduced, in other words, since transmittance becomes large, sensitivity of transmittance and reception of ultrasound waves are similarly improved.

In the present invention, as a material constituting an acoustic lens, usable is copolymer rubber, for example, a homopolymer such as conventionally known silicon rubber, fluorine silicon rubber, polyurethane rubber, epichlorohydrin rubber or the like, an ethylene-propylene copolymer formed via copolymerization of ethylene and propylene, or the like. Of these, silicon based rubber is preferably used.

Examples of silicon based rubber employed in the present invention include silicone rubber, fluorine silicone rubber and so forth. Most of all, silicone rubber is preferably used in view of properties of the lens material. The silicone rubber means organolpolysiloxane having a molecular moiety composed of Si—O bonds, in which plural organic groups are mainly bonded to the Si atoms, and conventionally, the main component is methylpolysiloxane, and at least 90% of the entire organic groups are methyl groups. Those in which a phenyl group, a vinyl group, an allyl group or the like are also usable. The silicone rubber can be obtained, for example, by kneading a hardener (vulcanizing agent) such as benzoyl peroxide or the like in organopolysiloxane having a high polymerization degree to conduct curing via heat-valcanization. Vulcanizing aids, for example, organic or inorganic fillers such as silica, nylon powder and so forth, sulfur, zinc oxide and so forth may be added, if desired.

As butadiene based rubber employed in the present invention, provided is copolymerized rubber in which a slight amount of styrol or acrylonitrile is copolymerized to butadiene singly or as a main body, or the like. Most of all, butadiene rubber is preferably used in view of properties of a lens material. The butadiene rubber means synthetic rubber obtained via polymerization of butadiene having a conjugate double bond. The butadiene rubber can be obtained via 1.4 or 1.2 polymerization of butadiene singly which has a conjugate double bond. As the butadiene rubber, usable are those vulcanized with sulfur or the like.

An acoustic lens in the present invention can be obtained by mixing silicon based rubber in butadiene based rubber to conduct curing via vulcanization. For example, silicone rubber and butadiene rubber are mixed at appropriate ratio by a kneading roll; a vulcanizing agent such as benzoyl or the like is added therein; and crosslinking (curing) is conducted via heat-vulcanization to obtain it In this case, as a vulcanizing aid, zinc oxide is preferably added. Zinc oxide is capable of accelerating vulcanization, and of shortening vulcanizing time thereof with no degradation of lens properties. In addition, other additives may be added within the range where properties of a colorant and an acoustic lens are not deteriorated. As to the mixing ratio of silicon based rubber to butadiene based rubber, the sound velocity is smaller than that of a human body, together with the acoustic impedance being close to the human body, and a mixing ratio of 1:1 is conventionally desirable in order to obtain reduced attenuation, but the mixing ratio is appropriately changeable.

Silicone rubber is commercially available, and usable examples thereof include KE742U, KE752U, KE931U, KE941U, KE951U, KE961U, KE850U, KE555U, KE575U and so forth, produced by Shin-Etsu chemical Co., Ltd.; TSE221-3U, TE221-4U, TSE2233U, XE20-523-4U, TSE271U, TSE260-3U and TSE260-4U, produced by Momentive Performance Materials Inc.; SH35U, SH55UA, SH831U, SE6749U, SE112OUS, SE4704U and so forth, produced by Dow Corning Toray Co., Ltd.; and so forth.

In addition, in the present invention, rubber raw material such as the above-described silicon based rubber or the like is used as a base (main component), and inorganic filler such as silica, alumina, titanium oxide and so forth, an organic resin such as nylon and so forth, or the like can be blended (diagnostic ultrasound systems).

The ultrasound probe of the present invention can be applied to various kinds of diagnostic ultrasound systems. For example, it is suitably usable as diagnostic ultrasound systems as shown in FIG. 1.

FIG. 1 is a conceptual diagram showing a structure of main parts of diagnostic ultrasound systems 100 in an embodiment of the present Invention. The diagnostic ultrasound system 100 are equipped with an ultrasound probe 102 (probe) in which a piezoelectric material transducer 103 and 104 are arranged which transmits an ultrasound wave to an object such as a patient 101 and receives an ultrasound wave reflected from the object as an echo signal. The diagnostic ultrasound systems are further equipped with a transmitting and receiving circuit 105, which supplies an electrical signal to the ultrasound probe 102 to generate ultrasound wave and receives an echo signal which each piezoelectric transducer in the ultrasound wave probe receives, and a control circuit 110 for transmission and reception, which controls transmission and reception of the transmitting and receiving circuit 109.

The systems are further equipped with an image data converting circuit 106, which coverts an echo signal which the transmitting and receiving circuit receives to an ultrasound image data of an object. The systems are equipped with a display control circuit 107, which controls a monitor 108 with an ultrasound image data converted by the image data converting circuit 106 displays an image, and a control circuit 110, which controls the entire diagnostic ultrasound systems 100.

The control circuit for transmission and reception 109, the image data converting circuit 106, and the display control circuit 107 are connected to the control circuit 110, and the operation thereof is controlled through the control circuit 110. An electrical signal is applied to each piezoelectric transducer 103, 104 in the ultrasound probe to transmit ultrasound waves to an object and reflection waves generated by acoustic impedance mismatching inside the object 101 is received by the ultrasound probe 102.

The diagnostic ultrasound systems as described above, equipped with the transducer for ultrasound reception in the present invention which is excellent in piezoelectric e characteristic and thermal resistance and is suitable for high frequency and broad band, can provide an ultrasound image with improved image quality and reproduction stability in comparison to a conventional technique.

EXAMPLE

Next, the present invention will be described referring to examples, but the present invention is not limited thereto.

Example 1

Preparation of Organic Piezoelectric Material Film

A compound or a polymeric compound represented by Formula (1) as well as a compound represented by Formula (2) as shown in Table 1 was coated on the surface of a 25 μm thick polyimide film having been subjected to aluminum vapor deposition in advance so as to make a dry film thickness to be 7 μm, followed by drying to prepare organic piezoelectric material film-1—organic piezoelectric material film-16, and comparative organic piezoelectric material film-1—comparative organic piezoelectric material film-4.

Comparative organic piezoelectric material film-5 and comparative organic piezoelectric material film-6 were prepared similarly to the above-described preparation, except that the compound represented by Formula (1) was replaced by each of comp-A and comp-B.

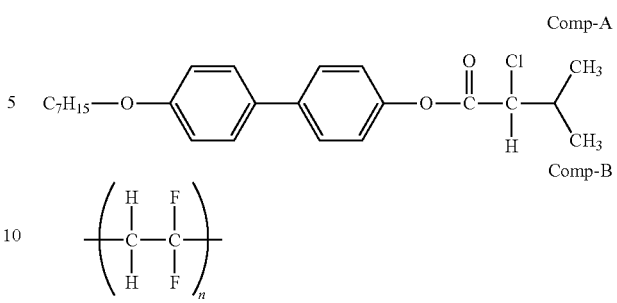

Evaluation of Organic Piezoelectric Material Film

The resulting organic piezoelectric material films were examined to evaluate piezoelectric e characteristic at room temperature or during heating up to 100° C. The results are shown in Table 1. In addition, the piezoelectric characteristic is shown as a relative value at a time when a PVDF film value measured at room temperature is set to 100.

TABLE 1

| | | | | Base material (including the case of being composed of 2 kinds) | | | | | | |
|---|---|---|---|---|---|---|---|---|---|---|
| No. | *1 | CLogP (1) | *2 | ClogP (2) | Organic polymeric material (base material) | CLogP (base material) | *Ratio (%) | OPF, Comp *A OPF | *3 | *4 | *5 |
| 1 | 1-1 | 11.0 | 2-27 | 12.0 | — | — | 75 | 1.0 OPF-1 | 183 | A | Inv |
| 2 | 1-6 | 10.6 | 2-27 | 12.0 | — | — | 75 | 1.4 OPF-2 | 178 | A | Inv |
| 3 | 1-8 | 10.5 | — | Uncalculated | Polystyrene 4000 | 10.7 | 60 | 0.2 OPF-3 | 170 | A | Inv |
| 4 | 1-12 | 10.8 | 2-27 | 12.0 | — | Uncalculated | 75 | 1.2 OPF-4 | 180 | A | Inv |
| 5 | 1-13 | 9.2 | — | Uncalculated | Polystyrene 4000 | 10.7 | 60 | 1.5 OPF-5 | 176 | A | Inv |
| 6 | 1-17 | 11.5 | 2-29 | 12.6 | — | Uncalculated | 60 | 1.1 OPF-6 | 178 | A | Inv |
| 7 | 1-21 | 13.4 | 2-27 | 12.0 | — | Uncalculated | 75 | 1.4 OPF-7 | 176 | A | Inv |
| 8 | 1-26 | 13.1 | 2-29 | 12.6 | — | Uncalculated | 60 | 0.5 OPF-8 | 179 | A | Inv |
| 9 | 1-32 | 11.6 | — | Uncalculated | Polystyrene 4000 | 10.7 | 60 | 0.9 OPF-9 | 172 | A | Inv |
| 10 | 1-36 | 9.7 | — | Uncalculated | Polystyrene 4000 | 10.7 | 60 | 1.0 OPF-10 | 168 | A | Inv |
| 11 | 1-41 | 12.9 | 2-29 | 12.6 | — | Uncalculated | 60 | 0.3 OPF-11 | 177 | A | Inv |
| 12 | 1-61 | 15.5 | 2-29 | 12.6 | — | Uncalculated | 60 | 2.9 OPF-12 | 174 | A | Inv |
| 13 | 1-1 | 11.0 | 2-27 | 12.0 | Polystyrene 4000 | 10.7 | 30 + 25 | *a$_1$ OPF-13 | 182 | A | Inv |
| 14 | 1-1 | 11.0 | 2-27 | 12.0 | Polystyrene 4000 | 10.7 | 30 + 25 | *a$_2$ OPF-14 | 179 | A | Inv |
| 15 | 1-1 | 11.0 | 2-29 | 12.6 | — | Uncalculated | 60 | 1.6 OPF-15 | 178 | A | Inv |
| 16 | 1-1 | 11.0 | 2-12 | 9.5 | — | Uncalculated | 75 | 1.5 OPF-16 | 179 | A | Inv |
| 17 | 1-1 | 11.0 | — | Uncalculated | — | Uncalculated | 0 | — Comp OPF-1 | 175 | — | Comp |
| 18 | 1-13 | 9.2 | 2-29 | 12.6 | — | Uncalculated | 10 | 3.4 Comp OPF-2 | 86 | B | Comp |
| 19 | 1-71 | 16.0 | 2-25 | 7.2 | — | Uncalculated | 10 | 8.8 Comp OPF-3 | 53 | C | Comp |
| 20 | 1-71 | 16.0 | — | Uncalculated | Polystyrene 4000 | 10.7 | — | 5.3 Comp OPF-4 | 78 | B | Comp |
| 21 | Comp-A | 7.4 | 2-25 | 7.2 | — | Uncalculated | 75 | 0.2 Comp OPF-5 | 83 | A | Comp |
| 23 | Comp-B | 3.9 | — | Uncalculated | — | Uncalculated | — | — Comp OPF-6 | 100 | — | Comp |

*1: Compound represented by Formula (1)
*2: Compound (base material) represented by Formula (2)
*Ratio: Ratio of a compound represented by Formula (2), or of an organic polymeric material
*A: |CLogP (1) − CLogP (base material)| or |CLogP (1) − CLogP (2)|
*a$_1$: 0.3 {difference from (base material)} 1.0 {difference from (2)}
*a$_2$: 0.3 {difference from (base material)} 1.0 {difference from (2)}
OPF, CompOPF: Organic piezoelectric material film, Comparative organic piezoelectric material film
*3: Characteristic: Piezoelectric e characteristic (relative value)
*4: Compatibility
*5: Remarks
Inv: Present invention
Comp: Comparative example As is clear from Table 1, the piezoelectric characteristic of each of organic piezoelectric material films formed from compounds of the present invention is superior to that of each Comparative example.

Example 2

Evaluation and Preparation of Ultrasound Probe

<Preparation of Piezoelectric Material for Transmission>

$CaCO_3$, $La_2O_3$, $Bi_2O_3$ and $TiO_2$ as component raw materials, and MnO as an accessory component were arranged to be provided, the component raw materials were weighed so as to make the final component composition to be $(Ca_{0.97}La_{0.03})Bi_{4.01}Ti_4O_{15}$. Next, pure water was added therein, and the resulting was mixed in pure water for 8 hours employing a ball mill in which a medium made of zirconia was charged, followed by sufficiently drying to obtain mixed powder. The resulting mixed powder was tentatively molded, and tentatively baked in the air at 800° C. for 2 hours to prepare the tentative baked. Next, pure water was added into the resulting tentative baked, and fine pulverization was conducted in pure water employing a ball mill in which a medium made of zirconia was charged, followed by drying to prepare piezoelectric ceramics raw material powder. The piezoelectric ceramics raw material powder having a particle diameter of 100 nm was obtained via fine pulverization by varying a duration of the fine pulverization as well as pulverization conditions. Six % by weight of pure water as a binder were added into the piezoelectric ceramics raw material powder having a different particle diameter, the resulting was press-molded to prepare a tentative molding body in the form of a plate having a thickness of 100 μm; and this tentative molding body in the form of a plate was vacuum-packed to subsequently conduct molding via pressing at a pressure of 235 MPa. Next, the foregoing molding body was baked. The finally resulting sintering body has a thickness of 20 μm. In addition, the calcination temperatures each were 1100° C. A polarization was carried out via application of an electric field of 1.5×Ec (MV/m) or more for one minute.

<Preparation of Laminated Transducer for Reception>

After an aluminum electrode was evaporated on the surface of a substrate of organic piezoelectric material-1 prepared in the foregoing Example 1, temperature was raised to 200° C. at a rate of 5° C./min while applying an electric field of 100 MV/m employing a high voltage power supply HARB-20R60 (manufactured by Matsusada Precision Inc.); maintained at 200° C. for 15 minutes, and subsequently, cooled gradually to room temperature while applying voltage to conduct a poling treatment. Organic piezoelectric material-1 having been subjected to a polarization, and a laminated transducer in which a polyester film having a thickness of 50 μm were attached to each other employing an adhesive was prepared.

Next, In accordance with a conventional method, a laminated transducer was laminated on the above-described piezoelectric material for transmission, and a backing layer and an acoustic matching layer are also provided to prepare an ultrasound probe.

In addition, a probe as a comparative example was prepared similarly to the above-described ultrasound probe, except that the above-described laminated transducer for reception was replaced by comparative organic piezoelectric material film-5.

Next, as to the above-described two kinds of ultrasound probes, receiving sensitivity and dielectric break down strength were measured, and evaluation thereof was made.

In addition, as to receiving sensitivity, a fundamental frequency $f_1$ of 5 MHz was transmitted, and $f_2$ of receiving second harmonic wave, $f_3$ of third harmonic wave and $f_4$ of fourth harmonic wave were set to 10 MHz, 15 MHz and 20 MHz, respectively to determine relative receiving sensitivity. A sound intensity measuring system Model 805 (1-50 MHz) {manufactured by Sonora Medical System, Inc.: 2021 Miller Drive Longmont, Colo. (0501 USA)} was employed to measure the relative receiving sensitivity.

In order to measure dielectric breakdown strength, load power P was quintupled, and the load power was returned to the base after testing for 10 hours to evaluate the relative receiving sensitivity. When a drop in sensitivity is within 1% compared with that before load testing, the evaluation was made, and designated as "Excellent"; in the case of a drop in sensitivity exceeding 1% and of less than 10% compared with that before load testing, the evaluation was made, and designated as "Pass", and in the case of a drop in sensitivity of 10% or more compared with that before load testing, the evaluation was made, and designated as "Failure".

It was confirmed in the above-described evaluations that an ultrasound probe equipped with a piezoelectric (material) laminated transducer for reception of the present invention exhibited 1.3 times the relative receiving sensitivity, together with excellent dielectric breakdown strength, in comparison to that of the comparative example. That is, it was confirmed that a transducer for ultrasound reception of the present invention was also suitably usable for a probe used in diagnostic ultrasound systems, as shown in FIG. 1.

EXPLANATION OF NUMERALS

100 Diagnostic ultrasound systems
101 Living body
102 Ultrasound probe
103 Ultrasound transducer for transmission
104 Ultrasound transducer for reception
105 Transmitting and receiving transducer
106 Image data converting circuit
107 Display control circuit
108 Image display
109 Control circuit for transmission and reception
110 Control circuit

The invention claimed is:

1. An organic piezoelectric material comprising a compound represented by the following Formula (1) and a base material made of an organic polymeric material, satisfying the following Expression (1) when C Log P values of the compound and the base material are expressed as C Log P (1) and C Log P (base material), respectively:

$$R_1-Q-(A_1)-Y-Z, \qquad \text{Formula (1)}$$

wherein $R_1$ represents one selected from the group consisting of an aliphatic group, an aromatic group and a heterocyclic group; Q is a single bond, an oxygen atom or a sulfur atom; $A_1$ represents a mesogenic group; Y represents one selected from the group consisting of a urea group, a thiourea group, a urethane group, a thiourethane group, an amide group, a thioamide group, a sulfamoyl group and a carbonate group; and Z represents one selected from the group consisting of an aliphatic group having 1-25 carbon atoms, an aromatic group and a heterocyclic group, and $$|C \log P(1) - C \log P(\text{base material})| \leq 3.0, \qquad \text{Expression (1)}$$

wherein the C Log P is a calculated log P determined via Hansch's and Leo's fragment approach.

2. The organic piezoelectric material of claim 1, wherein $R_1$ in Formula (1) represents an alkyl group having 1-20 carbon atoms or an oxyalkyl group.

3. The organic piezoelectric material of claim 1, wherein Z in Formula (1) represents a substituent comprising an asymmetric carbon atom.

4. The organic piezoelectric material of claim 1, comprising the compound represented by Formula (1) and a compound represented by the following Formula (2) as the base material made of the organic polymeric material, satisfying the following Expression (2) when a C Log P value of the compound represented by Expression (2) is expressed as C Log P (2):

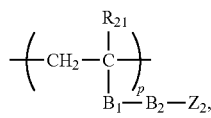

Formula (2)

wherein $R_{21}$ represents a hydrogen atom or a methyl group, p is an integer of 5 or more, $B_1$ represents an alkylene group or an oxyalkylene group, $B_2$ represents a mesogenic group, $Z_2$ represents one selected from the group consisting of an aliphatic group having 1-25 carbon atoms, an aromatic group and a heterocyclic group, and $$|C \operatorname{Log} P(1) - C \operatorname{Log} P(2)| \leq 3.0, \quad \text{Expression (2)}$$

wherein the C Log P is a calculated log P determined via Hansch's and Leo's fragment approach.

5. An ultrasound probe comprising a transducer for ultrasound transmission and an ultrasound transducer comprising the organic piezoelectric material of claim 1 as a transducer for ultrasound reception.

6. An ultrasound image detector comprising the ultrasound probe of claim 5.

\* \* \* \* \*